United States Patent
Sakakura (10) Patent No.: US 8,197,942 B2
(45) Date of Patent: Jun. 12, 2012

(54) GAS BARRIER SHEET

(75) Inventor: Osamu Sakakura, Sayama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 313 days.

(21) Appl. No.: 12/531,128

(22) PCT Filed: Sep. 27, 2007

(86) PCT No.: PCT/JP2007/068810
§ 371 (c)(1),
(2), (4) Date: Sep. 14, 2009

(87) PCT Pub. No.: WO2008/117487
PCT Pub. Date: Oct. 2, 2008

(65) Prior Publication Data
US 2010/0098955 A1    Apr. 22, 2010

(30) Foreign Application Priority Data

Mar. 23, 2007  (JP) .................. 2007-075888
Jun. 20, 2007  (JP) .................. 2007-163081

(51) Int. Cl.
*B32B 9/04* (2006.01)
*B32B 27/30* (2006.01)

(52) U.S. Cl. ...................... 428/446; 428/451

(58) Field of Classification Search .......... 428/446, 428/451
See application file for complete search history.

(56) References Cited

U.S. PATENT DOCUMENTS

| 2005/0029513 A1 | 2/2005 | Kawashima et al. ........ 257/40 |
| 2006/0003189 A1* | 1/2006 | Kim et al. ................. 428/704 |
| 2006/0093758 A1* | 5/2006 | Sakakura et al. ........... 428/1.6 |
| 2007/0026243 A1 | 2/2007 | Iwanaga et al. ........... 428/446 |

FOREIGN PATENT DOCUMENTS

| JP | 08-142256 A1 | 6/1996 |
| JP | 2004-063453 A1 | 2/2004 |
| JP | 2004-148673 A1 | 5/2004 |
| JP | 2004-299230 A1 | 10/2004 |
| JP | 2005-313560 A1 | 11/2005 |
| JP | 2007-015350 A1 | 1/2007 |

* cited by examiner

*Primary Examiner* — D. S. Nakarani
(74) *Attorney, Agent, or Firm* — Burr & Brown (57) ABSTRACT

There is provided a gas barrier sheet that has high productivity, good gas barrier properties, and anticurling properties. In particular, a gas barrier sheet is provided that, even after a heat cycle test which is performed as a durability test for organic EL displays and the like, can suppress the occurrence of curling and can maintain gas barrier properties. The gas barrier sheet comprises a gas barrier film 3 provided on a base material 2. The gas barrier film 3 is an $SiN_xO_y$ film, wherein $x=0.5$ to $1.5$ and $y=0.25$ to $1$, has an absorption intensity of IR absorption ($830$ cm$^{-1}$ to $840$ cm$^{-1}$), corresponding to an Si—N bond, per unit thickness of $0.5\times10^{-3}$/nm to $1.8\times10^{-3}$/nm and has a refractive index of $1.7$ to $2.1$.

16 Claims, 2 Drawing Sheets

GAS BARRIER SHEET

FIELD OF THE INVENTION

The present invention relates to a gas barrier sheet. More specifically, the present invention relates to a gas barrier sheet that has high productivity, is less likely to curl, and has excellent gas barrier properties.

BACKGROUND OF THE INVENTION

An attempt has hitherto been made to form a thin film of an inorganic material or an organic material on a base material film and thus to develop a high level of gas barrier properties by the gas barrier film. For example, Japanese Patent Application Laid-Open No. 313560/2005 proposes a gas barrier film having a laminated structure comprising a flexible base material, and a 0.1 to 10 μm-thick acrylic resin layer of a cured product of a UV curable resin containing only an acrylic monomer and/or an acrylic polymerizable prepolymer as a polymerizable component and a 20 to 100 nm-thick inorganic barrier layer stacked in that order from the flexible base material side on one side or both sides of the flexible base material.

The claimed advantage of the techniques disclosed in the above patent documents is that the formation of a UV cured resin layer having a specific thickness using a specific UV curable resin directly on a flexible base material followed by stacking of an inorganic barrier layer having a specific thickness on the UV cured layer can provide a gas barrier film that, while enjoying good gas barrier properties, hardly causes curling in the production process of the gas barrier film. For example, $SiO_x$, $AlO_x$, $SiO_xN_y$, $SiN_x$, $SiO_xN_yC_z$, $SiN_xC_y$, $AlO_xN_y$, $AlN_x$, $AlO_xN_yC_z$, and $AlN_xC_y$ are exemplified as ceramic materials for use in the inorganic barrier layer.

In this film, a combination of an acrylic resin film having a specific thickness with a gas barrier film having a specific thickness formed of an inorganic material has simultaneously realized gas barrier properties of the gas barrier sheet and the suppression of curling.

From the viewpoint of improving the productivity of the gas barrier sheet, however, there is a demand for simultaneous realization of the gas barrier properties and the suppression of curling by the gas barrier film alone.

Organic EL displays are thin and have a variable shape, that is, are flexible and thus are expected as next-generation flat-panel displays. The organic EL displays, however disadvantageously suffer from low water resistance. Specifically, when water or oxygen invades through defects such as pin holes present on a cathode surface in an organic EL display, nonluminescent areas are formed due to oxidation of a cathode metal and interfacial peeling between the cathode metal and the organic compound. These nonluminescent areas significantly deteriorate display quality and, at the same time, leads to lowered brightness. Such nonluminescent areas are generally called "dark spots" or "black spots." In order to suppress the occurrence of the dark spots or black spots and to ensure the display quality, the invasion of water or oxygen into the organic EL display should be suppressed. To this end, an attempt has been made to apply a gas barrier sheet to the organic EL display.

In the application of the gas barrier sheet to the organic EL display, a high level of gas barrier properties are required of the gas barrier sheet from the viewpoint of guaranteeing a good display quality of the organic EL display. Specifically, the gas barrier sheet should have a gas permeability of one-hundredth or one-thousandth or less of the gas permeability required in food-related fields where gas barrier sheets are generally used. Accordingly, in order to apply the gas barrier sheet to the organic EL display well, a gas barrier sheet having a higher level of gas barrier properties than the conventional gas barrier sheet should be developed.

A heat cycle test may be mentioned as one of durability evaluation tests of the organic EL display. In the heat cycle test, the procedure of holding the organic EL display at an elevated temperature for a given period of time is repeated to evaluate the durability of the organic EL display. Therefore, also when the gas barrier sheet is applied to the organic EL display, it is desirable that the gas barrier sheet provided in contact with the organic EL display does not cause deformation such as curling and a deterioration in gas barrier properties upon exposure to the heat cycle test.

SUMMARY OF THE INVENTION

Problems to be Solved by the Invention

The present invention has been made with a view to solving the above problems of the prior art, and a first object of the present invention is to provide a gas barrier sheet that has high productivity, has good gas barrier properties, and has suppressed curling. In particular, a first object of the present invention is to provide a gas barrier sheet that, even after a heat cycle test performed as a durability test for organic EL displays and the like, is less likely to cause curling and can maintain the gas barrier properties.

A second object of the present invention is to provide a gas barrier sheet that has high productivity, has good gas barrier properties, is less likely to undergo curling, and further can realize high adhesion of a gas barrier film. In particular, a second object of the present invention is to provide a gas barrier sheet that, even after a heat cycle test performed as a durability test such as organic EL displays, is less likely to cause curling and can maintain gas barrier properties.

Means for Solving the Problems

In the course of research and development of gas barrier sheets having excellent denseness and flexibility, the present inventor has found that a gas barrier film as such can have an enhanced level of gas barrier properties and does not undergo curling by improving the composition of an inorganic material used in the gas barrier film and the quality of the gas barrier film even when a UV cured resin film of an acrylic resin or the like is not used. The present inventor has particularly found that a gas barrier sheet, which has a high level of gas barrier properties required of organic EL displays, is less likely to cause curling even after a heat cycle test performed as a durability test for organic EL displays and can maintain the gas barrier properties, can be produced. The present invention has been made based on such finding.

According to a first aspect of the present invention, there is provided a gas barrier sheet comprising: a base material; and a gas barrier film provided on the base material, wherein the gas barrier film is an $SiN_xO_y$ film, wherein x=0.5 to 1.5 and y=0.25 to 1, has an absorption intensity of IR absorption (830 $cm^{-1}$ to 840 $cm^{-1}$), corresponding to an Si—N bond, per unit thickness of $0.5 \times 10^{-3}$/nm to $1.8 \times 10^{-3}$/nm and has a refractive index of 1.7 to 2.1.

According to a second aspect of the present invention, there is provided a gas barrier sheet comprising: a base material; and a gas barrier film provided on the base material, wherein the gas barrier film is an $SiN_mO_lC_n$ film, wherein m=0.5 to 1.5, l=0.25 to 1, and n=0.1 to 1, has an absorption intensity of IR absorption (830 cm$^{-1}$ to 840 cm$^{-1}$), corresponding to an Si—N bond, per unit thickness of $0.5\times10^{-3}$/nm to $1.5\times10^{-3}$/nm and has a refractive index of 1.8 to 2.3.

In a first embodiment of the present invention, when the gas barrier film is an $SiN_xO_y$ film, wherein x=0.5 to 1.5 and y=0.25 to 1, has an absorption intensity of IR absorption (830 cm$^{-1}$ to 840 cm$^{-1}$), corresponding to an Si—N bond, per unit thickness of $0.5\times10^{-3}$/nm to $1.8\times10^{-3}$/nm and has a refractive index of 1.7 to 2.1, the amount of the Si—N bond per unit thickness can be increased. Further, in this case, the density of the gas barrier film can be increased to allow good gas barrier properties to be ensured by the gas barrier film alone, and the introduction of a predetermined amount of oxygen can reduce film stress. Consequently, a gas barrier sheet, which has high productivity, good gas barrier properties, and anticurling properties, can be provided. In particular, a gas barrier sheet can be provided that, even after a heat cycle test which is performed as a durability test for organic EL displays and the like, has suppressed curling and can maintain gas barrier properties.

In a second embodiment of the present invention, when the gas barrier film is an $SiN_mO_lC_n$ film, wherein m=0.5 to 1.5, l=0.25 to 1, and n=0.1 to 1, has an absorption intensity of IR absorption (830 cm$^{-1}$ to 840 cm$^{-1}$), corresponding to an Si—N bond, per unit thickness of $0.5\times10^{-3}$/nm to $1.5\times10^{-3}$/nm and has a refractive index of 1.8 to 2.3, the amount of the Si—N bond per unit thickness can be increased. Further, in this case, the density of the gas barrier film can be increased to allow good gas barrier properties to be ensured by the gas barrier film alone, and the introduction of a predetermined amount of oxygen can reduce film stress. Further, the introduction of carbon can enhance the strength of adhesion of the gas barrier film to the base material or the like. As a result, a gas barrier sheet, which has high productivity, has good gas barrier properties, is less likely to cause curling, and further can realize high adhesion of the gas barrier film can be provided. In particular, a gas barrier sheet, which is less likely to undergo curling even after a heat cycle test performed as a durability test for organic EL displays and the like and can maintain the gas barrier properties, can be provided.

In a preferred embodiment of the gas barrier sheet according to the present invention, the gas barrier film has an extinction coefficient of not less than 0.000001 and not more than 0.03.

In a preferred embodiment of the present invention, when the gas barrier film has an extinction coefficient of not less than 0.000001 and not more than 0.03, the transparency of the gas barrier film can easily be ensured. Consequently, a gas barrier sheet having a high level of transparency can be provided.

In another preferred embodiment of the gas barrier sheet according to the present invention, a transparent electroconductive film is provided on the gas barrier film.

In a preferred embodiment of the present invention, since a transparent electroconductive film is provided on a gas barrier film which is less likely to undergo curling, the transparent electroconductive film can be utilized as an anode in the organic EL display and, consequently, can improve the productivity of the organic EL display.

Further, in still another preferred embodiment of the gas barrier sheet according to the present invention, a hard coat film is provided on at least one side of the gas barrier sheet.

In a preferred embodiment of the present invention, since a hard coat film is provided on at least one side of the gas barrier sheet, the gas barrier sheet can be protected by the hard coat film and, consequently, a gas barrier sheet, which is less likely to be scratched, can be provided.

In a further preferred embodiment of the gas barrier sheet according to the present invention, an anchor coating agent layer is provided between the base material and the gas barrier film, and the anchor coating agent layer contains at least one of a composition comprising a cardo polymer, a polyfunctional acrylic resin, a layered compound, a silane coupling agent containing an organic functional group and a hydrolyzable group, and a crosslinkable compound containing a second organic functional group reactive, with the organic functional group as raw materials.

In a preferred embodiment of the present invention, since an anchor coating agent layer is provided between the base material and the gas barrier film and the anchor coating agent layer contains at least one of a composition comprising a cardo polymer, a polyfunctional acrylic resin, a layered compound, a silane coupling agent containing an organic functional group and a hydrolyzable group, and a crosslinkable compound containing a second organic functional group reactive with the organic functional group, possessed by the silane coupling agent, as raw materials, the adhesion between the gas barrier film and the base material can be improved and, consequently, a gas barrier sheet having high adhesion can be provided.

DESCRIPTION OF REFERENCE CHARACTERS 1 1A, 1B, 1C, and 1D Gas barrier sheets
2 Base material
3 3A and 3B Gas barrier films
4 Transparent electroconductive film
5 Hard coat film
6 Stainless steel substrate
8 Peak
9 Anchor coating agent layer
10 Gas barrier sheet sample

DETAILED DESCRIPTION OF THE INVENTION

Embodiments of the present invention will be described. However, it should be noted that the present invention is not limited by the following embodiments and various variations are possible within the scope of the subject matter of the present invention.

Figure 1:
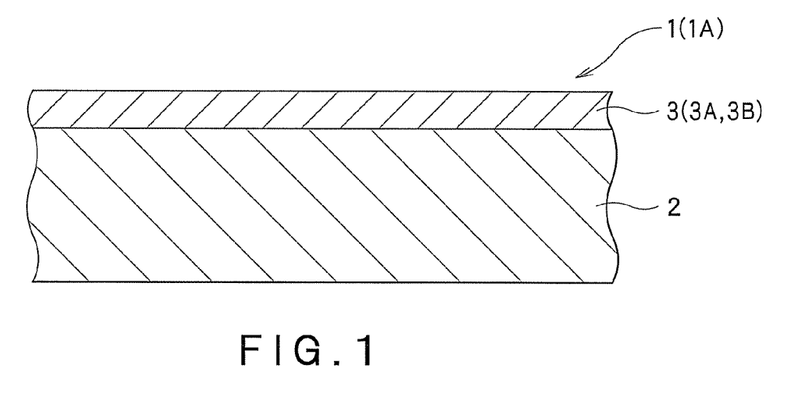
FIG. 1 is a typical cross-sectional view of one embodiment of the gas barrier sheet according to the present invention.
Figure 2:
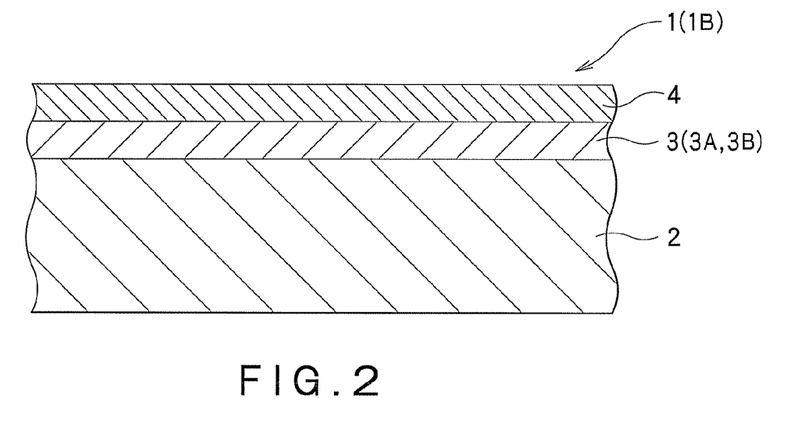
FIG. 2 is a typical cross-sectional view of another one embodiment of the gas barrier sheet according to the present invention.
Figure 3:
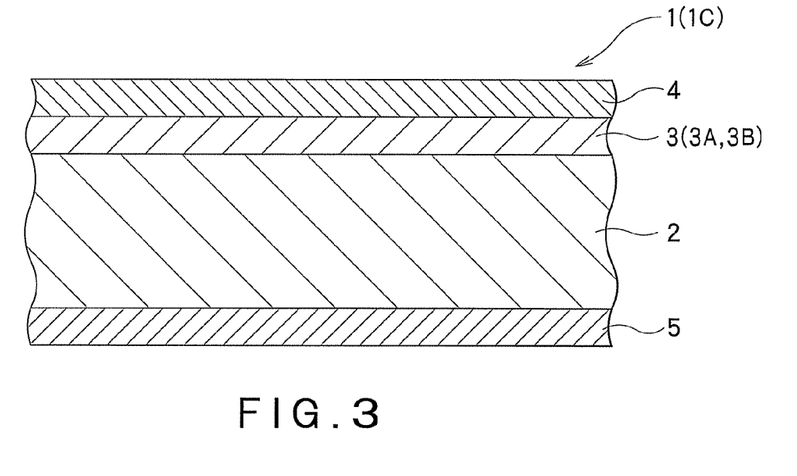
FIG. 3 is a typical cross-sectional view of still another one embodiment of the gas barrier sheet according to the present invention.
Figure 5:
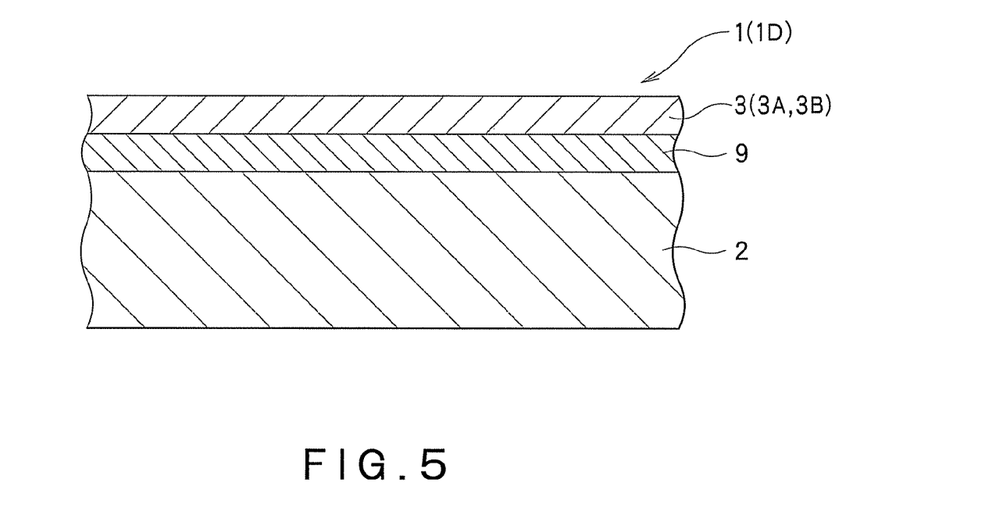
FIG. 5 is a typical cross-sectional view of a further one embodiment of the gas barrier sheet according to the present invention.

FIG. 1 is a typical cross-sectional view of one embodiment of the gas barrier sheet according to the present invention, FIG. 2 a typical cross-sectional view of another one embodiment of the gas barrier sheet according to the present invention, FIG. 3 a typical cross-sectional view of still another one embodiment of the gas barrier sheet according to the present invention, and FIG. 5 a typical cross-sectional view of a further one embodiment of the gas barrier sheet according to the present invention.

As shown in FIG. 1, a gas barrier sheet 1 (1A) according to the present invention has a construction comprising a gas barrier film 3 stacked on a base material 2. Further, as shown in FIG. 2, a gas barrier sheet 1 (1B) according to the present invention may also have a construction comprising a gas barrier film 3 provided on a base material 2 and a transparent electroconductive film 4 stacked on the gas barrier film 3. Furthermore, as shown in FIG. 3, a gas barrier sheet 1 (1C) according to the present invention may also have a construction comprising a hard coat film 5 provided on at least one side of a gas barrier sheet 1C. More specifically, the gas barrier sheet 1C comprises a base material 2 and a gas barrier film 3 and a transparent electroconductive film 4 stacked in that order on the base material 2. A hard coat film 5 is provided on the base material 2 on its surface remote from the gas barrier film 3. Alternatively, a gas barrier film may be provided instead of the hard coat film 5. In the gas barrier sheet 1A, the base material 2 and the gas barrier film 3 are provided in contact with each other. Alternatively, one or a plurality of anchor coating agent layers and films such as smoothing films may be provided between the base material 2 and the gas barrier film 3. In fact, in a gas barrier sheet 1D shown in FIG. 5, an anchor coating agent layer 9 is provided between the base material 2 and the gas barrier film 3. Likewise, the anchor coating agent layer and the film such as the smoothing film may also be provided in the interface of the base material 2 and the gas barrier film 3 in the gas barrier sheets 1B and 1C, in the interface of the gas barrier film 3 and the transparent electroconductive film 4, and in the interface of the base material 2 and the hard coat film 5. Further, in the gas barrier sheet 1C, the hard coat film 5 may be provided on its transparent electroconductive film 4 side. The variation in the stacking of films may be properly performed within the scope of the subject matter of the present invention. Individual layers constituting the gas barrier sheet according to the present invention will be described in more detail.

<Base Material>

Various base materials may be used as the base material 2, and the base material 2 may be mainly in a sheet form, a film form, or a wound roll form. A nonflexible substrate or a flexible substrate may be used according to specific applications, purposes and the like. For example, nonflexible substrates such as glass substrates, hard resin substrates, wafers, printed boards, various cards, and resin sheets may be used. Alternatively, for example, flexible substrates formed of, for example, polyethylene terephthalate (PET), polyamide, polyolefin, polyethylene naphthalate (PEN), polycarbonate, polyacrylate, polymethacrylate, polyurethane acrylate, polyethersulfone, polyimide, polysilsesquioxane, polynorbornene, polyetherimide, polyarylate, amorphous cyclopolyolefin, and cellulose triacetate may be used. When the base material 2 is formed of a resin, the above exemplified resin may also be properly used as a mixture. Further, when the base material 2 is formed of a resin, preferably, the base material has a heat resistance of 100° C. or above, particularly preferably 150° C. or above.

Specific examples of the base material 2 formed of a resin include commercially available products, for example, amorphous cyclopolyolefin resin films (for example, ZEONEX (registered trademark) and ZEONOR (registered trademark), manufactured by ZEON CORPORATION, and ARTON, manufactured by JSR CORPORATION), polycarbonate films (for example, PURE-ACE, manufactured by TEIJIN CHEMICALS LTD.), polyethylene terephthalate films (for example, those manufactured by TEIJIN CHEMICALS LTD.), cellulose triacetate films (for example, Konica Tac KC4UX and KC8UX, manufactured by Konica Minolta Opto, Inc.), and polyethylene naphthalate films (for example, TEONEX (registered trademark), manufactured by Teijin DuPont Films).

From the viewpoints of flexibility and shape retention, the thickness of the base material 2 is generally not less than 10 μm, preferably not less than 50 μm, and is generally not more than 200 μm, preferably not more than 150 μm.

When the base material 2 is used as a substrate for light emitting devices such as organic EL displays required to be transparent, the base material 2 is preferably colorless and transparent. When other films such as the gas barrier film in addition to the base material 2 are colorless and transparent, the gas barrier sheets 1A, 1B, and 1C can be transparent. More specifically, for example, a construction is preferably adopted in which the average light transmittance of the base material 2 at a wavelength in the range of 400 nm to 700 nm is not less than 80%. Since the light transmittance is influenced by the quality of the material and the thickness of the base material 2, the light transmittance is properly determined by taking into consideration both the quality of the material and the thickness of the base material 2.

The surface of the base material 2 is preferably smooth. Specifically, the arithmetical mean roughness (Ra) of the surface of the base material 2 is generally not less than 0.3 nm. When the arithmetical mean roughness (Ra) is in the above-defined range, a suitable level of surface roughness can be imparted to the base material 2. Further, in this case, when the base material 2 is in a wound roll form, the slip of contact face between base materials 2 in contact with each other is less likely to occur. The arithmetical mean roughness (Ra) of the surface of the base material 2 is generally not more than 100 nm, preferably not more than 50 nm, more preferably not more than 30 nm. When the arithmetical mean roughness (Ra) of the surface of the base material 2 is in the above-defined range, the smoothness of the base material 2 is improved. As a result, the advantage of suppressing short-circuiting that sometimes occur in the production of display devices such as organic EL displays can easily be attained. The arithmetical mean roughness (Ra) is a value as measured according to JIS B 0601-2001 (that complies with ISO 4287-1997).

The base material 2 is preferably less likely to be deformed upon exposure to heat. This is because, when the gas barrier sheets 1A, 1B, and 1C are applied to the organic EL display, the gas barrier sheets 1A, 1B, and 1C should not be deformed upon exposure to heating/cooling stress such as in a heat cycle test. Specifically, the base material 2 generally has a coefficient of linear expansion of not less than 5 ppm/° C. and not more than 80 ppm/° C. and is preferably not more than 50 ppm/° C. The coefficient of linear expansion may be measured by a conventional method, for example, by a TMA method (a thermomechanical analytical method). The TMA method can be performed with a measuring apparatus, for example, with CN8098F1, manufactured by Rigaku Corporation, that is a differential expansion-type thermomechanical analytical apparatus.

When the use of the base material 2 formed of a resin is contemplated, the base material 2 can be produced by a conventional common method. Further, in this case, a stretched film may be used. The stretching may be performed by a conventional common method. The stretch ratio may be properly selected according to the resin as the raw material for the base material 2 and is preferably 2 to 10 times each in a longitudinal direction and in a transverse direction.

The surface of the base material 2 may be subjected to surface treatment such as corona treatment, flame treatment, plasma treatment, glow discharge treatment, roughening treatment, heat treatment, or chemical treatment. Specific methods for surface treatment may be properly selected conventional methods. An anchor coating agent layer may also be provided on the surface of the base material 2 from the viewpoint of improving adhesion to the gas barrier film 3 and the like. Proper conventional anchor coating agent layers may be properly used as the anchor coating agent layer.

<Gas Barrier Film>

In the present invention, gas barrier films 3 in two embodiments may be used.

Gas Barrier Film in First Embodiment

A gas barrier film 3A in the first embodiment is an $SiN_xO_y$ film, wherein $x=0.5$ to 1.5 and $y=0.25$ to 1, has an absorption intensity of IR absorption (830 cm$^{-1}$ to 840 cm$^{-1}$), corresponding to an Si—N bond, per unit thickness of $0.5\times10^{-3}$/nm to $1.8\times10^{-3}$/nm and has a refractive index of 1.7 to 2.1.

The use of the gas barrier film 3A is advantageous in that the amount of Si—N bond per unit thickness can be increased, the density of the gas barrier film 3A can also be enhanced to allow good gas barrier properties to be ensured by the gas barrier film 3A per se, and the film stress can be reduced by introducing a predetermined amount of oxygen. Consequently, a gas barrier sheet having high productivity, good gas barrier properties, and suppressed curling can be provided. In particular, a gas barrier sheet, which is less likely to undergo curling and can maintain gas barrier properties even after a heat cycle test performed as a durability test, for example, for organic EL displays, can be provided.

The gas barrier film 3A is an $SiN_xO_y$ film wherein $x=0.5$ to 1.5 and $y=0.25$ to 1. The conventional gas barrier film, which has hitherto been used for gas barrier purposes, is an $SiN_aO_b$ film wherein $a=0.5$ and $b=1.5$, or $a=1.4$ and $b=0.1$. In the present invention, the use of the specific $SiN_xO_y$ film can allow the amount of the Si—N bond, which contributes to the gas barrier properties, to be ensured and, at the same time, can allow oxygen in an amount proper for imparting flexibility to the gas barrier film to be ensured. Accordingly, both the gas barrier properties and the suppression of curling can be simultaneously realized even by the sole use of the gas barrier film. Further, the balance between the denseness that contributes to ensure the gas barrier properties and the flexibility that contributes to the suppression of curling is so good that cracking of the gas barrier film and the separation of the gas barrier film from the base material or the like upon exposure to stress caused by heating/cooling can be suppressed. As a result, even after the heat cycle test, curling is less likely to occur, and a deterioration in gas barrier properties as a result of cracking in the gas barrier film can also be suppressed.

x in the $SiN_xO_y$ film as the gas barrier film is not less than 0.5, preferably not less than 0.7, and not more than 1.5, preferably not more than 1.3. When x is in the above-defined x range, the amount of Si—N bond in the gas barrier film can be ensured and the gas barrier properties of the gas barrier film can easily be improved. On the other hand, y is not less than 0.25, preferably not less than 0.3, and is not more than 1, preferably not more than 0.7. When y is in the above-defined y range, the content of oxygen in the gas barrier film can be ensured and flexibility can easily be imparted to the gas barrier film. Elements and other materials other than Si, N, and O may be contained as impurities and additives in the gas barrier film.

Whether or not the gas barrier film is formed of a predetermined $SiN_xO_y$ film can be confirmed, for example, by determining the atomic ratio of Si, N, and O. The atomic ratio can be determined by a conventional method. For example, the atomic ratio can be evaluated based on the results obtained with an analyzer, for example, for XPS (X-ray photoelectron spectroscopy). In the present invention, XPS is performed with ESCA LAB220i-XL, manufactured by VG Scientific Ltd. The X-ray source is an MgKα radiation in which the intensity of an Ag-3d-5/2 peak is 300 Kcps to 1 Mcps. In this case, a slit having a diameter of about 1 mm is used. The measurement is performed in such a state that a detector is set on a normal line in a sample surface for the measurement. In this measurement, proper electrification correction is performed. The analysis after the measurement is performed for peaks corresponding to binding energies of Si: 2 P, C: 1 s, N: 1 s, and O: 1 s with a software Eclipse version 2.1 attached to the XPS apparatus. In this case, each peak shift is corrected using a peak corresponding to hydrocarbon, among peaks of C: 1 s, as a standard, and a peak bonding state is attributed. Each peak is subjected to Sherley's background removal, and sensitivity coefficient correction (Si=0.87, N=1.77, and O=2.85 for C=1.0) of each element is performed for the peak area to determine the atomic ratio. For the obtained atomic ratio, while the number of atoms of Si is presumed to be 1, the number of atoms of N and O as other components are calculated to determine the proportions of components.

In the gas barrier film in the first embodiment, the absorption intensity of IR absorption (830 cm$^{-1}$ to 840 cm$^{-1}$), corresponding to an Si—N bond, per unit thickness is $0.5\times10^{-3}$/nm to $1.8\times10^{-3}$/nm. The amount of the Si—N bond per unit thickness of the gas barrier film can be estimated from the absorption intensity of IR absorption (830 cm$^{-1}$ to 840 cm$^{-1}$), corresponding to an Si—N bond, per unit thickness. Accordingly, when the absorption intensity is in the above-defined range, a predetermined amount of Si—N bond can be allowed to exist per unit thickness. As a result, the distance between the Si—N bond is decreased, and, thus, oxygen and water vapor is less likely to permeate the gas barrier film, whereby the gas barrier properties can easily be ensured. More specifically, the absorption intensity of IR absorption (830 cm$^{-1}$ to 840 cm$^{-1}$), corresponding to an Si—N bond, per unit thickness is not less than $0.5\times10^{-3}$/nm, preferably not less than $0.7\times10^{-3}$/nm. When the absorption intensity is in the above-defined range, the amount of the Si—N bond per unit thickness can be ensured and the water-repellent Si—N bond can suppress permeation to ionic oxygen and water vapor. On the other hand, the larger the amount of the Si—N bond per unit thickness, the better the gas barrier properties. When the amount of the Si—N bond is increased, the hardness of the gas barrier film is likely to be increased. When the amount of the Si—N bond is excessively large, the flexibility of the gas barrier sheet is unsatisfactory. Accordingly, the absorption intensity of IR absorption (830 cm$^{-1}$ to 840 cm$^{-1}$), corresponding to an Si—N bond, per unit thickness is not more than $1.8\times10^{-3}$/nm. The absorption intensity of IR absorption (830 cm$^{-1}$ to 840 cm$^{-1}$), corresponding to an Si—N bond, per unit thickness expresses the amount of the Si—N bond per unit thickness and is partially influenced by the x value as the composition ratio of nitrogen in the $SiN_xO_y$ film. The absorption intensity, however, is basically a parameter that is independently of the composition ratio of the $SiN_xO_y$ film. The reason for this is that, even in gas barrier films having the same composition ratio, the amount of the Si—N bond per unit thickness can be regulated independently of the composition ratio.

The absorption intensity of IR absorption (830 cm$^{-1}$ to 840 cm$^{-1}$), corresponding to an Si—N bond, per unit thickness in the gas barrier film can be determined by measuring an infrared absorption spectrum for the gas barrier film and calculating the value of (intensity of infrared absorption peak at a wave number of 830 cm$^{-1}$ to 840 cm$^{-1}$ corresponding to the Si—N bond)/(thickness of gas barrier film 3A). The infrared absorption spectrum can be generally measured with an infrared spectrophotometer. In the present invention, the infrared absorption spectrum is measured with a Fourier Transform Infrared Spectrometer (HerschelFT-IR-610, manufactured by JASCO Corporation) equipped with an attenuated total reflection (ATR) measuring device. An attenuated total reflection method (an ATR method) is used for the measurement. In this case, a standard light source is used, the detector is MCT, and the measurement is performed under conditions of measuring range 4000 to 400 cm$^{-1}$, cumulated number 256, and resolution 4 cm$^{-1}$. The thickness of the gas barrier film may be measured by conventional methods. In the present invention, the thickness of the gas barrier film is measured with a level difference meter (DEKTAK IIA, manufactured by ULVAC, Inc.) under conditions of scanning range 2 mm and scanning speed low.

The gas barrier film in a first embodiment has a refractive index of 1.7 to 2.1. The refractive index of the gas barrier film is a value that reflects the density of the gas barrier film. Accordingly, the density of the gas barrier film can be increased by increasing the refractive index. When the density of the gas barrier film can be increased, the permeability of the gas barrier film to oxygen and water vapor can be lowered resulting in improved gas barrier properties. The refractive index is not less than 1.7, preferably not less than 1.8. When the refractive index is in the above-defined range, the density of the gas barrier film can be ensured and, thus, the permeation of the gas barrier film to oxygen and water vapor can be suppressed. On the other hand, from the viewpoint of ensuring the gas barrier properties, increasing the density of the gas barrier film is preferred. Accordingly, increasing the refractive index is preferred. Increasing the refractive index, however, is likely to increase the hardness of the gas barrier film. Therefore, when the refractive index is excessively large, the flexibility of the gas barrier sheet is unsatisfactory. For this reason, the refractive index is not more than 2.1, preferably not more than 2.0. The $SiN_xO_y$ film can be understood as a mixture of silicon nitride with silicon oxide. The refractive index of the gas barrier film can be determined as a value calculated from a mixing ratio between the refractive index of silicon nitride (about 2.45) and the refractive index of silicon oxide (about 1.45). Therefore, the refractive index is likely to be influenced by the composition ratio of the $SiN_xO_y$ film rather than the absorption intensity per unit thickness. However, even when the gas barrier film 3A has an identical composition ratio, the refractive index can be varied by varying the density of the gas barrier film 3A. Accordingly, the composition ratio and the refractive index of the $SiN_xO_y$ film can be regulated independently of each other.

The refractive index of the gas barrier film can be measured by conventional methods. For example, the refractive index of the gas barrier film can be measured with an ellipsometer. In the present invention, the refractive index is measured with UVISEL™ manufactured by JOBIN YVON S.A.S. using a xenon lamp as a light source under conditions of incidence angle −60°, detection angle 60°, and measuring range 1.5 eV to 5.0 eV.

The thickness of the gas barrier film is generally not less than 10 nm, preferably not less than 30 nm, and is generally not more than 200 nm, preferably not more than 150 nm. When the thickness of the gas barrier film is in the above-defined range, the gas barrier properties and the suppression of curling can be simultaneously realized even by the gas barrier film alone.

When the gas barrier film is used as a gas barrier film in a light emitting device such as an organic EL display required to be transparent, the gas barrier film is preferably transparent. When other films such as the base material in addition to the gas barrier film are transparent, the gas barrier sheet can be transparent. More specifically, for example, a construction is preferably adopted in which the transparency is not less than 75% in terms of the average light transmittance of the gas barrier film at a wavelength in the range of 400 nm to 700 nm. Since the light transmittance is influenced by the composition and thickness of the gas barrier film, the light transmittance is provided by taking into consideration both the composition and thickness of the gas barrier film.

The extinction coefficient of the gas barrier film is preferably not less than 0.000001 and not more than 0.03 from the viewpoint of ensuring the transparency of the gas barrier film. The extinction coefficient is more preferably not less than 0.000005, still more preferably not less than 0.00001 and is more preferably not more than 0.01, still more preferably not more than 0.005. When the extinction coefficient is in the above-defined range, the transparency of the gas barrier film can easily be ensured. As a result, a gas barrier sheet having high transparency can be provided.

In the gas barrier film, the extinction coefficient can be measured by conventional methods. For example, the extinction coefficient of the gas barrier film can be measured with an ellipsometer. In the present invention, the extinction coefficient is measured with UVISEL™ manufactured by JOBIN YVON S.A.S. using a xenon lamp as a light source under conditions of incidence angle −60°, detection angle 60°, and measuring range 1.5 eV to 5.0 eV.

The gas barrier film preferably has insulating properties. Specifically, when the gas barrier sheet according to the present invention is used as a substrate for displays and as a sealing film for displays such as organic EL displays, preferably, the gas barrier film has insulating properties from the viewpoint of suppressing short-circuiting between the cathode and the anode in the display. More specifically, the surface resistivity of the gas barrier film 3A is preferably not less than $10^{10}$ Ω/sq., more preferably not less than $10^{11}$ Ω/sq. The higher the surface resistivity, the better the results. The surface resistivity is usually not more than $10^{16}$ Ω/sq.

The surface resistivity of the gas barrier film can be measured by conventional methods. In the present invention, the surface resistivity is measured with Hiresta UP (MCP-HT450) that is a high resistivity meter manufactured by Dia Instruments Co., Ltd.

The gas barrier film can be produced by any production process without particular limitation, and examples thereof include vacuum vapor deposition, sputtering, ion plating, Cat-CVD, plasma CVD, and atmospheric pressure plasma CVD. The production process can be selected by taking into consideration, for example, the type of film forming materials, easiness of film formation, and process efficiency. Some of these production processes will be described.

The vacuum vapor deposition method is a method in which a material placed in a crucible is heated and evaporated by electric resistance heating, high frequency induction heating, or beam heating such as electron beams or ion beams and is deposited on the base material to form a gas barrier film. In this case, a reactive vapor deposition method may also be adopted that can vary the heating temperature and heating method depending, for example, upon the composition of the gas barrier film and causes, for example, an oxidation reaction in the film formation.

The sputtering method is a method that comprises placing a target within a vacuum chamber, applying a high voltage to allow an ionized rare gas element (usually argon) to collide against a target and thus to sputter atoms present on the surface of the target, and depositing the sputtered atoms onto the base material to form a gas barrier film. In this case, a reactive sputtering method may be used in which a nitrogen gas or an oxygen gas is allowed to flow into a chamber to react the elements sputtered from the target with nitrogen or oxygen to form a gas barrier film. Examples of sputtering methods include DC two electrode sputtering, RF two electrode sputtering, three electrode or four electrode sputtering, ECR sputtering, ion beam sputtering, and magnetron sputtering. The use of magnetron sputtering is preferred from the viewpoint of industry.

The ion plating method is a composite technique of vacuum vapor deposition and plasma. In principle, in the ion plating method, a part of evaporated particles are brought to ions or excited particles, by utilizing gas plasma, that are activated to form a thin film. In the ion plating method, reactive ion plating is effective that utilizes plasma of a reactive gas to cause bonding to evaporated particles, whereby a compound film is synthesized. The procedure is carried out in plasma, and, thus, the first requirement is to produce stable plasma. In many cases, low-temperature plasma using weakly ionized plasma in a low-gas pressure region is used. Accordingly, the ion plating method is preferably used in the formation of a mixture or a composite oxide. The ion plating method is classified roughly into a direct current excitation type and a high frequency excitation type according to discharge generation methods. Further, in some cases, a hollow cathode or an ion beam is used in the evaporation mechanism.

The plasma CVD method is a type of chemical vapor deposition. In the plasma CVD method, a starting material is gasified during plasma discharge and is supplied into the system, and gases within the system are allowed to collide against each other for mutual activation to form radicals. Accordingly, a reaction under a low temperature, which is impossible only in thermal excitation, is possible. The base material is heated by a heater from its back side, and a film is formed by a reaction during discharge between electrodes. The plasma CVD method is classified into HF (several tens to several hundreds of kHz), RF (13.56 MHz), and microwaves (2.45 GHz) according to frequency used in the generation of plasma. The method using microwaves is classified roughly into a method in which a reactive gas is excited and a film is formed during afterglow, and ECR plasma CVD in which microwaves are introduced into a magnetic field (875 gausses) satisfying ECR conditions. Further, the plasma CVD method can be classified into a capacitive coupling type (a parallel planar type) and an inductive coupling type (a coil type) according to plasma generation methods.

The gas barrier film in the first embodiment is formed of the $SiN_xO_y$ film wherein x=0.5 to 1.5 and y=0.25 to 1. The composition of the $SiN_xO_y$ film can be regulated by, while properly using the above introduced production processes, properly varying production conditions.

In the gas barrier film, the absorption intensity of IR absorption (830 cm$^{-1}$ to 840 cm$^{-1}$), corresponding to an Si—N bond, per unit thickness should be regulated to a predetermined range. As described above, this means that the amount of the Si—N bond per unit thickness is regulated. The regulation of the absorption intensity can also be performed, for example, by varying the type and concentration of gas in the film formation.

Specifically, when the sputtering method or the ion plating method is used, the amount of the Si—N bond per unit thickness of the gas barrier film can be regulated by varying the concentration of the nitrogen gas. For example, when the concentration of the nitrogen gas is increased, the density of nitrogen per unit thickness of the gas barrier film formed can be increased. Consequently, the amount of the Si—N bond per unit thickness is increased, and, thus, the absorption intensity can easily be brought to a predetermined range. On the other hand, increasing the concentration of the nitrogen gas does not affect the composition of the $SiN_xO_y$ film. Accordingly, the absorption intensity can easily be regulated solely independently of the composition of the $SiN_xO_y$ film.

On the other hand, when the plasma CVD method and the ion plating method are used, the composition and the amount of the Si—N bond per unit thickness of the $SiN_xO_y$ film in the gas barrier film can be regulated by using an ammonia gas. When an ammonia gas is used, a nitriding reaction can be accelerated and, consequently, the composition of the $SiN_xO_y$ film can easily be regulated while the amount of the Si—N bond per unit thickness (absorption intensity per unit thickness of IR absorption (830 cm$^{-1}$ to 840 cm$^{-1}$) corresponding to the Si—N bond) is less likely to be influenced. Accordingly, when the regulation of the composition of the $SiN_xO_y$ film solely without varying the amount of the Si—N bond per unit thickness is contemplated, the ammonia gas may be used.

In the gas barrier film, the refractive index should be regulated to a predetermined range. The refractive index can be regulated by regulating the density of the gas barrier film. Accordingly, the refractive index can be regulated, for example, by varying the deposition rate (film forming rate) of the gas barrier film to regulate the density of the gas barrier film. Among the above production processes, the ion plating method is particularly preferred, because the productivity is excellent and, at the same time, the regulation of the composition, refractive index, and the Si—N bond becomes easy.

Gas Barrier Film in Second Embodiment

The gas barrier film 3B in the second embodiment is formed of an $SiN_mO_lC_n$ film, wherein m=0.5 to 1.5, l=0.25 to 1, and n=0.1 to 1, has an absorption intensity of IR absorption (830 cm$^{-1}$ to 840 cm$^{-1}$), corresponding to an Si—N bond, per unit thickness of $0.5 \times 10^{-3}$/nm to $1.5 \times 10^{-3}$/nm and has a refractive index of 1.8 to 2.3.

The use of the gas barrier film is advantageous in that the amount of the Si—N bond per unit thickness can be increased, the density of the gas barrier film can also be increased to allow good gas barrier properties to be ensured even by the sole use of the gas barrier film, the introduction of a predetermined amount of oxygen can reduce the film stress to reduce the susceptibility to curling, and the introduction of carbon can enhance the strength of adhesion to the base material and the like. As a result, a gas barrier sheet, which has high productivity, has good gas barrier properties, has suppressed curling, and has high adhesion of the gas barrier film 3B, can be provided. In particular, a gas barrier sheet, which is less likely to cause curling even after a heat cycle test performed as a durability test, for example, for organic EL displays, and can maintain gas barrier properties can be provided.

The first difference between the gas barrier film 3B in the second embodiment and the gas barrier film 3A in the first embodiment is that the gas barrier film 3B is formed of an $SiN_mO_lC_n$ film, wherein m=0.5 to 1.5, l=0.25 to 1, and n=0.1 to 1, and a predetermined amount of carbon has been introduced, while the gas barrier film 3A is formed of an $SiN_xO_y$ film wherein x=0.5 to 1.5 and y=0.25 to 1 and carbon has not been introduced. The second difference between the gas barrier film 3B in the second embodiment and the gas barrier film 3A in the first embodiment is that, due to the introduction of carbon, as compared with the gas barrier film 3A, the upper limit of the absorption intensity of IR absorption (830 cm$^{-1}$ to 840 cm$^{-1}$), corresponding to the Si—N bond, per unit thickness and the refractive index range vary in the gas barrier film 3B. The gas barrier films 3A and 3B are the same as each other in the other points. Accordingly, the points of difference between the gas barrier films 3A and 3B will be described.

The gas barrier film 3B in the second embodiment is formed of an SiN$_m$O$_l$C$_n$ film wherein m=0.5 to 1.5, l=0.25 to 1, and n=0.1 to 1. The predetermined SiN$_m$O$_l$C$_n$ film is advantageous in that oxygen in an amount proper for imparting flexibility to the gas barrier film can be ensured while ensuring the amount of the Si—N bond, which contributes to the gas barrier properties, and, further, carbon in an amount proper for contribution to the adhesion of the gas barrier film can be ensured. Accordingly, ensuring the gas barrier properties, suppressing curling, and ensuring adhesion to the base material and the like can easily be performed by the gas barrier film 3B alone. In the SiN$_m$O$_l$C$_n$ film, the ranges of m and l and the meaning thereof are as defined in the SiN$_x$O$_y$ film in the gas barrier film 3A.

In the SiN$_m$O$_l$C$_n$ film used in the gas barrier film 3B, a predetermined amount of carbon is introduced. Specific carbon sources include, for example, lower hydrocarbons and alcohols, ketones, and acetaldehydes. The introduction of the so-called carbon can increase the strength of adhesion of the SiN$_m$O$_l$C$_n$ film to the base material or the like. The reason for this has not been elucidated yet, but is believed to reside in that carbon is bonded, as an organic functional group such as an alkyl group, an alkoxy group, a ketone group, or an acetaldehyde group, to a portion around Si or O. It is considered that, for example, when a resin film is used in the base material 2, the interaction between the organic functional group and the surface of the base material is increased and the strength of adhesion of the gas barrier film 3B to the base material 2 is improved. When the strength of adhesion of the gas barrier film 3B to the base material 2 and the like is increased, upon exposure to thermal stress caused by heating/cooling, the gas barrier film 3B is less likely to be separated, for example, from the base material 2 and the like. Even after a heat cycle test, curling can easily be suppressed, and, further, a deterioration in gas barrier properties can easily be suppressed. From the viewpoint of ensuring adhesion to the base material and the like, in the SiN$_m$O$_l$C$_n$ film, n is not less than 0.1, preferably not less than 0.3, and is not more than 1, preferably not more than 0.8.

As with the composition of the SiN$_x$O$_y$ film, the composition of the SiN$_m$O$_l$C$_n$ film can be analyzed by XPS. In this case, the measuring method may be basically the same as that in the SiN$_x$O$_y$ film, except that, in the SiN$_m$O$_l$C$_n$ film, since carbon is introduced, in the analysis after the measurement, each peak shift is corrected based on the peak corresponding to the hydrocarbon among C: 1 s peaks and each peak bonding state is attributed. Each peak is subjected to Sherley's background removal, and sensitivity coefficient correction (Si=0.87, N=1.77, and O=2.85 for C=1.0) of each element is performed for the peak area to determine the atomic ratio. In this case, peaks belonged to the hydrocarbon are excluded for the calculation of carbon. For the obtained atomic ratio, while the number of atoms of Si is presumed to be 1, the number of atoms of N, O, and C as other components are calculated to determine the proportions of components.

For the SiN$_m$O$_l$C$_n$ film used in the gas barrier film, the upper limit of the absorption intensity of IR absorption (830 cm$^{-1}$ to 840 cm$^{-1}$), corresponding to the Si—N bond, per unit thickness is 1.5×10$^{-3}$/nm and is smaller than the upper limit of the absorption intensity 1.8×10$^{-3}$/nm of the absorption intensity of the of the SiN$_x$O$_y$ film used in the gas barrier film 3A. The reason for this is that, in the SiN$_m$O$_l$C$_n$ film, due to the introduction of carbon, the ratio of the Si—N bond to the unit Si amount is lowered. The SiN$_m$O$_l$C$_n$ film used in the gas barrier film 3B in the second embodiment has a refractive index of 1.8 to 2.3 that is higher than the refractive index 1.7 to 2.1 of the SiN$_x$O$_y$ film used in the gas barrier film 3A in the first embodiment. The reason for this is that, in the SiN$_m$O$_l$C$_n$ film, due to the introduction of carbon, the density is increased. As with the refractive index of the SiN$_x$O$_y$ film, the refractive index of the SiN$_m$O$_l$C$_n$ film is preferably not less than 1.9 from the viewpoint of increasing the density and is preferably not more than 2.2 from the viewpoint of ensuring the flexibility of the film.

The extinction coefficient of the gas barrier film is preferably regulated to a predetermined range from the viewpoint of ensuring the transparency of the gas barrier film. This is the same as described in the gas barrier film 3A in the "gas barrier film in the first embodiment." Specifically, preferably, the extinction coefficient is not less than 0.000001 and not more than 0.03. The extinction coefficient is more preferably not less than 0.000005, still more preferably not less than 0.00001 and is more preferably not more than 0.01, still more preferably not more than 0.005. When the extinction coefficient is in the above-defined range, the transparency of the gas barrier film can easily be ensured. As a result, a highly transparent gas barrier sheet can be provided. The extinction coefficient in the gas barrier film can be measured by the same method as described in the "gas barrier film in the first embodiment."

Preferably, the gas barrier film has insulating properties. The reason why the gas barrier film preferably has insulating properties is the same as that in the "gas barrier film 3A in the first embodiment." Specifically, when the gas barrier sheet is used as a substrate for displays or a film for sealing for displays such as organic EL displays, preferably, the gas barrier film has insulating properties from the viewpoint of suppressing short-circuiting between a cathode and a anode provided in the display. More specifically, the surface resistivity of the gas barrier film is preferably not less than $10^{10}$ Ω/sq., more preferably not less than $10^{12}$ Ω/sq. The higher the surface resistivity, the better the results. The surface resistivity is generally not more than $10^{16}$ Ω/sq. The surface resistivity of the gas barrier film can be measured by the same method as described in the "gas barrier film in the first embodiment."

The SiN$_m$O$_l$C$_a$ film used in the gas barrier film in the second embodiment can be basically produced by the same production process as described in the SiN$_x$O$_y$ film in the first embodiment. From the viewpoint of introducing carbon into the gas barrier film, however, a method is preferably adopted in which, in forming the SiN$_m$O$_l$C$_n$ film on the base material, for example, a lower hydrocarbon or alcohol, a ketone, or an acetaldehyde is introduced as a reactive gas, and the reactive gas is activated by plasma in the reaction system and is incorporated in the thin film.

<Transparent Electroconductive Film>

The transparent electroconductive film 4 is provided on the gas barrier film 3. More specifically, in the gas barrier sheets 1B and 1C, the transparent electroconductive film 4 is provided on the gas barrier film 3 having improved anticurling properties. The transparent electroconductive film can be utilized as an anode of organic EL displays. Accordingly, the provision of the transparent electroconductive film 4 can improve the productivity of the organic EL displays.

Imparting electroconductive properties to the transparent electroconductive film is preferred. From this viewpoint, the transparent electroconductive film may be a coating film composed mainly of an inorganic oxide formed by coating a hydrolysate of a metal alkoxide or the like, or by coating transparent electroconductive particles and a hydrolysate of a metal alkoxide or the like.

From the viewpoint of imparting electroconductive properties, the transparent electroconductive film may be a film formed by a vacuum film forming method such as resistance heating vapor deposition, induction heating vapor deposition, EB vapor deposition, sputtering, ion plating, thermal CVD, and plasma CVD. For the transparent electroconductive film, an apparatus construction is possible that can lower the resistance value and can perform surface treatment. Accordingly, the transparent electroconductive film is preferably formed by EB vapor deposition, sputtering, or ion plating. Materials for use in the formation of the transparent electroconductive film by the above methods include, for example, indium-tin oxide (ITO), indium-tin-zinc oxide (ITZO), $ZnO_2$-type, CdO-type, and $SnO_2$-type materials. These materials may be properly selected and used. Among the above materials, indium-tin oxide (ITO) is preferred from the viewpoint of excellent transparency and electroconductive properties. When indium-tin oxide (ITO) is used, the use of indium-tin oxide (ITO) having a tin content of 5 to 15% by mole is particularly preferred.

The thickness of the transparent electroconductive film is generally not less than 10 nm, preferably not less than 60 nm, more preferably not less than 100 nm. When the thickness of the transparent electroconductive film is in the above-defined range, the electroconductive properties of the transparent electroconductive film 4 can easily be ensured. The thickness of the transparent electroconductive film 4 is generally not more than 1000 nm, preferably not more than 450 nm, still more preferably not more than 200 nm. When the thickness of the transparent electroconductive film 4 is in the above-defined range, the transparency of the transparent electroconductive film can easily be ensured and, further, good flexibility can easily be provided.

<Hard Coat Film>

The hard coat film 5 is provided on at least one side of the gas barrier sheet 1C. More specifically, the hard coat film 5 is provided on the surface of the base material 2 remote from the gas barrier film 3. Since the gas barrier sheet 1C is protected by the hard coat film 5, a gas barrier sheet having good scratch resistance can be provided.

A conventional hard coat film may be properly used as the hard coat film. Specifically, suitable materials for the hard coat film include acrylate-type ionizing radiation curing resins containing a functional group, that is, ionizing radiation curing resins having an acryl skeleton or an epoxy skeleton. When the hardness, heat resistance, solvent resistance, and scratch resistance of the hard coat film are taken into consideration, the adoption of a structure having a high crosslinking density is preferred. Such materials include, for example, di- or higher functional acrylate monomers such as ethylene glycol di(meth)acrylate, 1,6-hexanediol diacrylate, trimethylolpropane tri(meth)acrylate, pentaerythritol tri(meth)acrylate, dipentaerythritol penta(meth)acrylate, and di pentaerythritol hexa(meth)acrylate. The term "(meth)acrylate" as used herein means both acrylate and methacrylate.

When the ionizing radiation curing resin is used as the material for the hard coat film, the resin may be used in combination with conventional photopolymerization initiators and photosensitizers. The photopolymerization initiators and photosensitizers are preferred when ultraviolet light is applied to cure the ionizing radiation curing resin. The reason for this is that, when electron beams are applied, the ionizing radiation curing resin is likely to be satisfactorily cured. The addition amounts of the photopolymerization initiator and the photosensitizer are generally not less than 0.1 part by weight and not more than 10 parts by weight based on 100 parts by weight of the ionizing radiation curing resin. In addition to these materials, if necessary, solvents, curing catalysts, wetting improvers, plasticizers, antifoaming agents, thickening agents and other inorganic and organic various additives may be added.

The hard coat film may be formed by coating the above material as a coating liquid on the base material 2 and curing the coating. The coverage of the coating liquid is generally not less than 0.5 $g/m^2$ and not more than 15 $g/m^2$ on a solid basis. For example, an ultra-high pressure mercury lamps may be mentioned as an ultraviolet source for use in the curing. The wavelength of the ultraviolet light may be generally in a range of not less than 190 nm and not more than 380 nm. Further, electron beam sources usable herein include, for example, various electron beam accelerators such as Cockcroft-Walton accelerators.

The thickness of the hard coat film is generally not less than 1 µm, preferably not less than 3 µm, and is generally not more than 10 µm, preferably not more than 8 µm. When the thickness of the hard coat film is in the above-defined range, the transparency of the gas barrier sheet is less likely to be sacrificed and, further, good scratch resistance can easily be realized.

<Anchor Coating Agent Layer>

In the gas barrier sheet according to the present invention, as shown in FIG. 5, an anchor coating agent layer 9 may be provided between the base material 2 and the gas barrier film 3. Preferably, the anchor coating agent layer 9 is formed of at least one of the following materials: a cardo polymer; a polyfunctional acrylic resin; a layered compound; and a composition comprising a silane coupling agent and a crosslinkable compound, the silane coupling agent containing an organic functional group and a hydrolyzable group, the crosslinkable compound containing a second organic functional group reactive with the organic functional group in the silane coupling agent. The anchor coating agent layer 9 can improve the adhesion between the gas barrier film and the base material, and, consequently, a gas barrier sheet having high adhesion can be provided.

Cardo polymers usable in the anchor coating agent layer include, for example, cardo polymers having an epoxy group on its side chain or cardo polymers having an acryl group on its side chain. Among these cardo polymers, cardo polymers having an epoxy group on its side chain are preferred from the viewpoint of suppressing yellowing caused at elevated temperatures.

Polyfunctional acrylic resins usable in the anchor coating agent layer include, for example, 1,6-hexanediol diacrylate, trimethylolpropane tri(meth)acrylate, pentaerythritol tri(meth)acrylate, dipentaerythritol penta(meth)acrylate, and dipentaerythritol hexa(meth)acrylate. Among these polyfunctional acrylic resins, pentaerythritol tri(meth)acrylate and dipentaerythritol penta(meth)acrylate are preferred from the viewpoints of small film stress and surface flatness.

Layered compounds usable in the anchor coating agent layer include, for example, montmorillonite and layered silicates. Among these layered compounds, montmorillonite is preferred from the viewpoint of productivity.

Next, compositions usable in the anchor coating agent layer, comprising a silane coupling agent and a crosslinkable compound as raw materials, the silane coupling agent containing an organic functional group and a hydrolyzable group, the crosslinkable compound containing a second organic functional group reactive with the organic functional group in the silane coupling agent, will be described.

Examples of the organic functional group contained in the silane coupling agent include an γ-aminopropyltrimethoxy group, an N-β(aminoethyl)γ-aminopropyltriisopropoxy group, and an γ-aminopropyltriethoxy group. Among them, the γ-aminopropyltrimethoxy group is preferred from the viewpoint of regulating the reactivity. Examples of the hydrolyzable group contained in the silane coupling agent include an γ-glycidoxypropyl group, a hexamethylene diisocyanate, and an oxazoline-containing polymer. Among them, the γ-glycidoxypropyl group and the oxazoline-containing polymer are preferred from the viewpoint of necessity of adhesion and flexibility in the anchor coating agent layer. γ-Glycidoxypropyltrimethoxysilane may be mentioned as a preferred silane coupling agent.

Examples of the second organic functional group, which is reactive with the organic functional group contained in the silane coupling agent, in the crosslinkable compound include a methoxy group, an ethoxy group, and an isopropoxy group. Among them, the methoxy group and the isopropoxy group are preferred from the viewpoint of regulating the reactivity. Crosslinkable compounds containing the second organic functional group include, for example, hydrolysates of tetramethoxysilane, hydrolysates of tetraethoxysilane, and hydrolysates of hexamethylenedisiloxane. Among them, hydrolysates of tetraethoxysilane are preferred from the viewpoint of regulating the reactivity.

The content of the crosslinkable compound based on the silane coupling agent in the composition is generally not less than 90% by weight and not more than 99.99% by weight. A predetermined amount of materials (raw materials) other than the silane coupling agent and the crosslinkable compound may be contained in the composition.

The thickness of the anchor coating agent layer is generally not less than 0.05 μm, preferably not less than 0.1 μm, and is generally not more than 5 μm, preferably not more than 1 μm. The anchor coating agent layer may be formed by any conventional method that is properly selected depending upon the material used.

<Other Films>

In addition to the base material 2, the gas barrier film 3, the transparent electroconductive film 4, and the hard coat film 5 that have been described above, if necessary, other films may be used. The anchor coating agent layer 9 has been described above. In addition to the anchor coating agent layer 9, for example, an antireflection film, an antistatic film, an antifouling film, an anti-dazzling film, a color filter, and a smoothing film may be mentioned as optional films that may be provided. Among them, the antireflection film, the antistatic film, the antifouling film, the anti-dazzling film, and the color filter may be laminated onto the gas barrier sheet according to the present invention through an optical pressure-sensitive adhesive to provide desired functions.

The antireflection film has the function of suppressing external light reflection. The antistatic film has the function of preventing the adherence of dirt or dust. The antifouling film has the function of inhibiting the deposition of fats and oils such as fingerprints. Conventional antireflection films, antistatic films, and antifouling films may be properly used in the present invention. These films are in many cases provided on the surface of the hard coat film 5. An antireflection function and a transparent electroconductive function may also be imparted to the hard coat film 5. The smoothing film is used for surface flattening purposes. For example, the smoothing film is sometimes provided on the surface of the base material 2 and the surface of the gas barrier film 3.

Conventional smoothing films may be properly used as the smoothing film. Materials for the smoothing film include, for example, sol-gel materials, ionizing radiation curing resins, heat curing resins, and photoresist materials.

When the smoothing film is formed on the surface of the gas barrier film 3, the use of the ionizing radiation curing resin as the material for the smoothing film is preferred from the viewpoint of facilitating the formation of the film while maintaining the gas barrier function. More specifically, preferred are resins that contain a polymerizable unsaturated bond in their molecule and, upon exposure to ultraviolet light (UV) or electron beams (EB), cause a crosslinking polymerization reaction and consequently are converted to a three-dimensional polymer structure. Examples of such resins include ionizing radiation curing resins in which epoxy group-containing reactive prepolymers, oligomers and/or monomers have been properly mixed, and liquid compositions produced by mixing the ionizing radiation curing resin, if necessary, with a urethane, polyester, acrylic, butyral, vinyl, or other thermoplastic resin to prepare a liquid composition. The hard coat film 5 may be formed by coating the above resin by a conventional coating method, for example, roll coating, Mayer bar coating, or gravure coating, drying the coating, and curing the coating. The smoothing film may also be formed by the same method as used in the formation of the hard coat film 5.

When the smoothing film is formed on the surface of the gas barrier film 3, from the viewpoint of ensuring good adhesion to the gas barrier film 3, a sol-gel material is also preferably used, as the material for the smoothing film, that is adopted in a so-gel process which can form a coating film of the same material type as the material for the gas barrier film 3. The sol-gel process refers to a process in which a coating material composition comprising at least a silane coupling agent containing an organic functional group and a hydrolyzable group; and a crosslinkable compound containing an organic functional group reactive with the organic functional group contained in the silane coupling agent as raw materials is coated to form a coating film. Conventional silane coupling agents containing an organic functional group and a hydrolyzable group may be properly used. For example, aminoalkyldialkoxysilanes and aminoalkyltrialkoxysilanes disclosed in Japanese Patent Application Laid-Open No. 207130/2001 may be used. Examples of the crosslinkable compound containing an organic functional group reactive with the organic functional group contained in the silane coupling agent include crosslinkable compounds containing a functional group reactive with amino groups such as a glycidyl group, a carboxyl group, a isocyanate group, or an oxazoline group. Such materials may be any proper conventional material. Further, if necessary, solvents, curing catalysts, wetting improvers, plasticizers, antifoaming agents, thickening agents and other inorganic and organic various additives may be added to the coating material composition.

Further, a conventional cardo polymer is also preferably incorporated in the material for the smoothing film.

The thickness of the smoothing film is generally not less than 0.05 μm, preferably not less than 0.1 μm, and is generally not more than 10 μm, preferably not more than 5 μm.

<Gas Barrier Sheet>

The gas barrier sheets 1A, 1B, and 1C are formed by forming the base material 2, the gas barrier film 3, the transparent electroconductive film 4, the hard coat film 5, and, if necessary, other films. In the gas barrier sheets 1A, 1B, and 1C, the gas barrier film 3 has a predetermined composition, and the absorption intensity of IR absorption (830 cm$^{-1}$ to 840 cm$^{-1}$), corresponding to the Si—N bond, per unit thickness and the refractive index fall within the respective predetermined ranges. Accordingly, the gas barrier sheets 1A, 1B, and 1C are advantageous in that the productivity is high, the gas barrier properties are good, and curling can be suppressed. In particular, even upon exposure to a heat cycle test performed as a durability test, for example, for organic EL displays, the gas barrier sheets 1A, 1B, and 1C can have suppressed curling and can maintain gas barrier properties.

The gas barrier sheet according to the present invention has a high level of gas barrier properties, that is, generally has a water vapor permeability of not more than 0.1 g/m²/day (g/m²·day) and an oxygen permeability of not more than 0.1 cc/m²/day·atm (cc/m²·day·atm).

When the gas barrier sheet according to the present invention is used as the gas barrier sheet in light emitting devices such as organic EL displays which should be transparent, the gas barrier sheet is preferably transparent. In this case, specifically, the total light transmittance is preferably not less than 75%, more preferably not less than 80%. The color (YI) is preferably not more than 5, more preferably not more than 3. The higher the YI, the higher the degree of yellowing of the gas barrier sheet. Accordingly, preferably, YI is regulated to the above-defined range from the viewpoint of appearance. The total light transmittance and YI may be measured, for example, with a spectrophotometric colorimeter. In the present invention, the total light transmittance and YI are measured with an SM color computer SM-C (manufactured by Suga Test Instruments Co., Ltd.) according to JIS K 7105.

Figure 4:
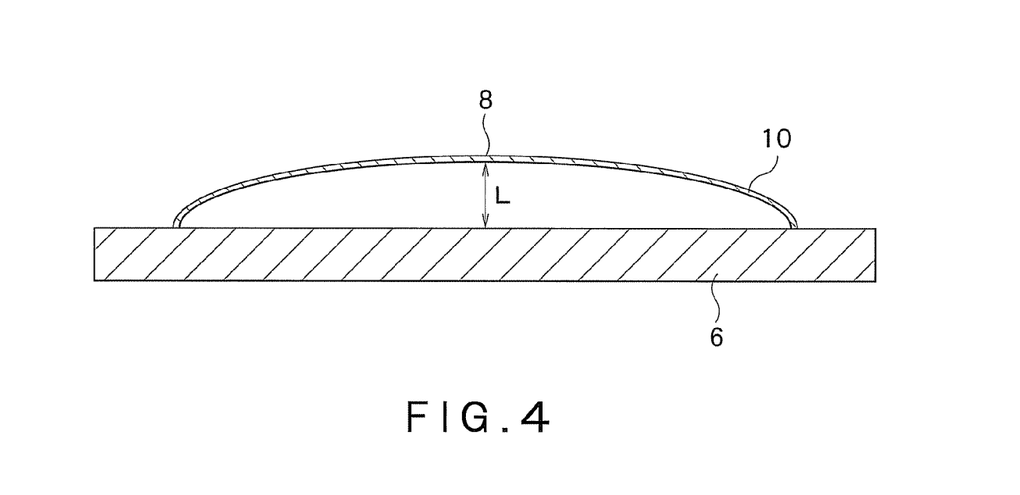
FIG. 4 is a typical cross-sectional view of a method for measuring the level of curling of a gas barrier sheet.

In the gas barrier sheet according to the present invention, curling is suppressed by virtue of the use of the predetermined gas barrier film 3. FIG. 4 is a typical cross-sectional view showing a method for measuring the degree of curling of the gas barrier sheet. At the outset, the gas barrier sheet is cut into a predetermined size to prepare a gas barrier sheet sample 10. The gas barrier sheet sample 10 is placed on a stainless steel substrate 6, and an orthogonal distance L between a peak point 8 in the gas barrier sheet sample 10 and the stainless steel substrate 6 is measured. The degree of curling of the gas barrier sheet is evaluated based on predetermined evaluation criteria according to the size of the orthogonal distance L.

Further, the gas barrier sheet sample 10 is subjected to a heat resistant test (a heat cycle test), and, the orthogonal distance L is again measured to evaluate the degree of curling of the gas barrier sheet after the heat cycle test. Specifically, the heat cycle test is performed by repeating the procedure of holding the gas barrier sheet sample 10 in an oven at 150° C. for 3 hr five times. The gas barrier sheet sample 10 after the heat cycle test is again placed on the stainless steel substrate 6, and the orthogonal distance L between the peak point of the gas barrier sheet sample 10 and the stainless steel substrate 6 is measured. The degree of curling of the gas barrier sheet may be evaluated based on predetermined evaluation criteria according to the size of the orthogonal distance L. The orthogonal distance L evaluated by the above method is generally regulated so that the difference in orthogonal distance L between before and after the heat cycle test is not more than 3 mm. The orthogonal distance L is preferably regulated to not more than 1 mm from the viewpoint of providing a gas barrier sheet having better properties.

The gas barrier sheet according to the present invention is preferably used in a film form. The gas barrier sheet in a film form can easily be applied, for example, to organic EL displays. The gas barrier sheet according to the present invention may also be used in a wound roll form and may be properly used according to a post-process of the production of the organic EL displays and the like. The gas barrier sheet according to the present invention can be used not only as substrates for organic EL displays and the like but also as sealing films as an alternative to sealing glasses or cans.

EXAMPLES

The following Examples further illustrate the present invention. However, it should be noted that the present invention is not limited to the description of these Examples as long as alterations modifications do not go beyond the subject of the present invention.

Examples 1 to 28

SiN$_x$O$_x$ Film

Gas barrier sheets comprising a gas barrier film provided on a base material were formed by film production processes and conditions for film formation specified in Table 1. In Table 1, "PECVD," "SP," and "IP" in the column of "production process" represent a plasma CVD process, a magnetron sputtering process, and an ion plating process, respectively. A 100 μm-thick polyethylene naphthalate film (TEONEX (registered trademark) Q65F, manufactured by Teijin DuPont Films) was used as a base material.

TABLE 1

| | Method for film formation | | Conditions for film formation | | | | | | | |
|---|---|---|---|---|---|---|---|---|---|---|
| | Production process | Material | Pressure during film formation [Pa] | Ar flow rate [sccm] | Nitrogen flow rate [sccm] | Oxygen flow rate [sccm] | H$_2$O$_2$ flow rate [sccm] | Ammonia flow rate [sccm] | RF power supply frequency [MHz] | Applied electric power [kW] |
| Ex. 1 | PECVD | Hexamethyl-disilazane | 10 | 10 | — | 30 | — | 5 | 13.56 | 1.8 |
| Ex. 2 | SP | Si$_3$N$_4$ target | 0.25 | 30 | — | 5 | — | — | 13.56 | 1.2 |
| Ex. 3 | SP | Si$_3$N$_4$ target | 0.17 | 30 | — | 10 | — | 10 | — | 11.0 |
| Ex. 4 | PECVE | Silane | 15 | 10 | — | — | — | 10 | 13.56 | 1.8 |
| Ex. 5 | PECVD | Silane | 14 | 10 | — | 5 | — | — | 13.56 | 1.6 |
| Ex. 6 | SP | Si$_3$N$_4$ target | 0.25 | 30 | 5 | — | — | — | — | 2.5 |
| Ex. 7 | SP | Si$_3$N$_4$ target | 0.31 | 30 | 10 | — | — | — | — | 3.2 |
| Ex. 8 | IP | Si$_3$N$_4$ particle | 0.16 | — | — | 5 | — | — | — | 5.1 |
| Ex. 9 | IP | Si$_3$N$_4$ particle | 0.15 | — | — | 8 | — | — | — | 5.2 |
| Ex. 10 | IP | Si$_3$N$_4$ particle | 0.15 | — | — | 10 | — | — | — | 5.2 |
| Ex. 11 | IP | Si$_3$N$_4$ particle | 0.16 | — | — | 14 | — | — | — | 5.1 |
| Ex. 12 | IP | Si$_3$N$_4$ particle | 0.16 | — | — | 20 | — | — | — | 5.0 |
| Ex. 13 | IP | Si$_3$N$_4$ particle | 0.15 | — | 5 | — | — | — | — | 5.3 |
| Ex. 14 | IP | Si$_3$N$_4$ particle | 0.14 | — | 8 | — | — | — | — | 5.4 |
| Ex. 15 | IP | Si$_3$N$_4$ particle | 0.16 | — | 10 | — | — | — | — | 5.3 |
| Ex. 16 | IP | Si$_3$N$_4$ particle | 0.17 | — | 14 | — | — | — | — | 5.5 |

TABLE 1-continued

| | | | Conditions for film formation | | | | | | |
|---|---|---|---|---|---|---|---|---|---|
| | Method for film formation | | Pressure | Ar flow | Nitrogen | Oxygen | $H_2O_2$ flow | Ammonia | RF power supply | Applied electric |
| | Production process | Material | during film formation [Pa] | rate [sccm] | flow rate [sccm] | flow rate [sccm] | rate [sccm] | flow rate [sccm] | frequency [MHz] | power [kW] |
| Ex. 17 | IP | $Si_3N_4$ particle | 0.17 | — | 20 | — | — | — | — | 5.6 |
| Ex. 18 | IP | $Si_3N_4$ particle | 0.14 | — | — | — | — | 5 | — | 5.4 |
| Ex. 19 | IP | $Si_3N_4$ particle | 0.13 | — | — | — | — | 10 | — | 5.3 |
| Ex. 20 | IP | $Si_3N_4$ particle | 0.12 | — | — | — | — | 20 | — | 5.5 |
| Ex. 21 | IP | $Si_3N_4$ particle | 0.16 | — | 10 | — | — | — | — | 7.5 |
| Ex. 22 | IP | $Si_3N_4$ particle | 0.15 | — | 10 | — | — | — | — | 10.3 |
| Ex. 23 | IP | $Si_3N_4$ particle | 0.23 | — | — | — | — | 5 | — | 5.4 |
| Ex. 24 | IP | $Si_3N_4$ particle | 0.36 | — | — | — | — | 5 | — | 5.4 |
| Ex. 25 | IP | $Si_3N_4$ particle | 0.42 | — | — | — | — | 5 | — | 5.4 |
| Ex. 26 | IP | $Si_3N_4$ particle | 0.15 | — | — | — | 5 | — | — | 5.3 |
| Ex. 27 | IP | $Si_3N_4$ particle | 0.14 | — | — | — | 10 | — | — | 5.4 |
| Ex. 28 | IP | $Si_3N_4$ particle | 0.15 | — | — | — | 15 | — | — | 5.4 |

Properties of the gas barrier sheets comprising respective gas barrier films thus prepared were evaluated as follows.

<Analysis of Composition>

The compositions of the gas barrier films (x and y values in $SiN_xO_y$), more specifically the atomic ratios of Si, N, and O, were measured by XPS (ESCA LAB220i-XL, manufactured by VG Scientific Ltd.). An MgKα radiation, which provides an Ag-3d-5/2 peak intensity of 300 Kcps to 1 Mcps, was used as an X-ray source, and a slit having a diameter of about 1 mm was used. The measurement was performed in such a state that a detector was set on a normal line of the surface of the sample to be measured. Further, proper electrification correction was performed. After the measurement, analysis was performed using peaks corresponding to binding energy of Si: 2 p, N: 1 s, and O: 1 s with a software Eclipse (version 2.1) attached to the XPS apparatus. In this case, each peak was subjected to Sherley's background removal, and sensitivity coefficient correction (Si=0.87, N=1.77, and O=2.85 for C=1.0) of each element was performed for the peak area to determine the atomic ratio. For the obtained atomic ratio, while the number of atoms of Si is presumed to be 1, the number of atoms of N and O as other components are calculated to determine the proportions of components. The data thus obtained are shown in the column of "Composition" in Table 2.

<Measurement of Refractive Index>

The refractive index of the gas barrier film was measured with UVISEL (trademark) manufactured by JOBIN YVON S.A.S. The measurement was performed using a xenon lamp as a light source under conditions of incidence angle −60°, detection angle 60°, and measuring range 1.5 eV to 5.0 eV. The data thus obtained are shown in the column of "Refractive index" in Table 2.

<Measurement of Thickness of Gas Barrier Film>

The thickness of the gas barrier film was measured with a level difference meter (DEKTAK IIA, manufactured by ULVAC, Inc.). The measurement was performed under conditions of scanning range 2 mm and scan speed low. The data thus obtained are shown in the column of "Film thickness" in Table 2.

<Measurement of Absorption Intensity of IR Absorption, Corresponding to Si—N Bond, Per Unit Thickness>

The infrared absorption spectrum was measured with a Fourier Transform Infrared Spectrometer (HerschelFT-IR-610, manufactured by JASCO Corporation) equipped with an attenuated total reflection (ATR) measuring device. An attenuated total reflection method (an ATR method) is used for the measurement. In this case, a standard light source was used, the detector was MCT, and the measurement was performed under conditions of measuring range 4000 to 400 $cm^{-1}$, cumulated number 256, and resolution 4 $cm^{-1}$.

In the infrared absorption spectrum, the intensity of the infrared absorption peak at a wave number of 830 $cm^{-1}$ to 840 $cm^{-1}$ corresponding to the Si—N bond was determined, and the absorption intensity of IR absorption (830 $cm^{-1}$ to 840 $cm^{-1}$), corresponding to the Si—N bond, per unit thickness was calculated by dividing the peak intensity by the thickness of the gas barrier film provided by the "measurement of the thickness of the gas barrier film." Specifically, the absorption intensity was determined by calculating the value of (intensity of infrared absorption peak at a wave number of 830 $cm^{-1}$ to 840 $cm^{-1}$ corresponding to the Si—N bond)/(thickness of gas barrier film). The data thus obtained are shown in the column of "IR absorption" in Table 2.

<Measurement of Water Vapor Permeability>

The water vapor permeability was measured with a water vapor permeability tester (a water vapor transmission rate tester) (PERMATRAN-W 3/31: tradename, manufactured by MOCON Inc., USA) under conditions of temperature 37.8° C., humidity 100% Rh. The data thus obtained are shown in the column of "WVTR" in Table 2. The detection limit of the water vapor permeability tester was 0.05 g/$m^2$·day, and, when the measured value was below the detection limit, the water vapor permeability was expressed as "m.1. (measuring limit)."

<Measurement of Oxygen Permeability>

The oxygen permeability was measured with an oxygen permeability tester (an oxygen transmission rate tester (OX-TRAN2/20: tradename, manufactured by MOCON Inc., USA) under conditions of temperature 23° C. and humidity 90% Rh. The date thus obtained are shown in the column of "OTR" in Table 2. The detection limit of the oxygen permeability tester was 0.05 cc/$m^2$·day·atm, and, when the measured value was below the detection limit, the oxygen permeability was expressed as "m.1. (measuring limit)."

<Measurement of Total Light Transmittance and Color (YI)>

The total light transmittance and YI of the gas barrier sheet were measured with an SM color computer SM-C (manufactured by Suga Test Instruments Co., Ltd.). The measurement was performed according to JIS K 7105. The data thus obtained are shown in the column of "total light transmittance" and the column of "YI" in Table 2.

<Evaluation of Curling>

The degree of curling was evaluated as follows.

Specifically, the gas barrier sheet prepared above was cut into a size of 15 cm×15 cm to provide a gas barrier sheet sample 10 shown in Table 4. As shown in Table 4, the gas barrier sheet sample 10 was placed on a stainless steel substrate 6, and an orthogonal distance L between a peak point 8 in the gas barrier sheet sample 10 and the stainless steel substrate 6 was measured. The degree of curling of the gas barrier sheet was evaluated based on the following evaluation criteria according to the orthogonal distance L. The data thus obtained are shown in "Just after film formation" in the column of "Curling" in Table 2.

○: Orthogonal distance of not more than 1 mm
Δ: Orthogonal distance of 1 to 3 mm
X: Orthogonal distance of more than 3 mm Next, a heat cycle test was performed for the gas barrier sheet sample 10, and, after the heat cycle test, the orthogonal distance L was again measured. The heat cycle test was performed by repeating the procedure consisting of holding the gas barrier sheet sample 10 in an oven at 150° C. for 3 hr and then cooling the sample to room temperature five times. The gas barrier sheet sample 10 after the heat cycle test was again placed on the stainless steel substrate 6, and the orthogonal distance L between the peak point of the gas barrier sheet sample 10 and the stainless steel substrate 6 was measured. The degree of curling of the gas barrier sheet was evaluated based on the above evaluation criteria according to the orthogonal distance L. The data thus obtained are shown in "After heat resistance test" in the column of "Curling" in Table 2.

<Evaluation of Surface Resistivity>

The surface resistivity of the gas barrier film was measured with Hiresta UP (MCP-HT450) that is a high resistivity meter manufactured by Dia Instruments Co., Ltd. As a result, the surface resistivity of the gas barrier film in Example 1, the surface resistivity of the gas barrier film in Example 2, and the surface resistivity of the gas barrier film in Example 13 were $3 \times 10^{12}$ Ω/sq., $5 \times 10^{12}$ Ω/sq., and $3 \times 10^{12}$ Ω/sq., respectively. For the gas barrier film in each of other Examples, the surface resistivity was on the order of $10^{12}$ Ω/sq.

<Evaluation of Extinction Coefficient>

The extinction coefficient of the gas barrier film was measured with UVISEL (trademark) manufactured by JOBIN YVON S.A.S. The measurement was performed using a xenon lamp as a light source under conditions of incidence angle −60°, detection angle 60°, and measuring range 1.5 eV to 5.0 eV. As a result, the extinction coefficient of the gas barrier film in Example 1, the extinction coefficient of the gas barrier film in Example 2, and the extinction coefficient of the gas barrier film in Example 13 were 0.03, 0.001, and 0.01, respectively.

Examples 29 to 31

$SiN_mO_lC_n$ Film

Gas barrier sheets were produced in the same manner as in Examples 1 to 28, except that the gas barrier film was an $SiN_mO_lC_n$ film. Methods and conditions for film formation are shown in Table 3. "PECVD" described in "Method for film formation" in Table 3 represents plasma CVD. Various properties of the gas barrier sheets were measured in the same manner as in Examples 1 to 28. The composition of the $SiN_mO_lC_n$ film may be analyzed by XPS measurement in basically the same manner as in the $SiN_xO_y$ film, except that, in the $SiN_mO_lC_n$ film, since carbon was introduced, in the

TABLE 2

| | Composition | | Refractive index | Film thickness | IR absorption | WVTR | OTR | Total light transmittance | YI | Curling | |
|---|---|---|---|---|---|---|---|---|---|---|---|
| | | | | | | | | | | Just after film formation | Heat resistance test |
| | x | y | [—] | [nm] | [×10⁻³/nm] | [g/m²·day] | [cc/m²·day·atm] | [%] | [—] | | |
| Ex. 1 | 1.45 | 0.25 | 2.10 | 100 | 1.76 | m.l. | m.l. | 75.9 | 3.46 | ○ | ○ |
| Ex. 2 | 0.75 | 0.85 | 1.73 | 100 | 0.53 | m.l. | m.l. | 83.5 | 2.06 | ○ | ○ |
| Ex. 3 | 1.00 | 0.35 | 1.98 | 100 | 1.04 | m.l. | m.l. | 81.2 | 2.51 | ○ | ○ |
| Ex. 4 | 1.31 | 0.25 | 2.08 | 131 | 1.65 | m.l. | m.l. | 76.8 | 8.21 | ○ | ○ |
| Ex. 5 | 1.21 | 0.45 | 2.03 | 128 | 1.43 | m.l. | m.l. | 78.4 | 5.36 | ○ | ○ |
| Ex. 6 | 0.67 | 0.98 | 1.71 | 53 | 0.52 | 0.08 | 0.06 | 82.9 | 1.56 | ○ | ○ |
| Ex. 7 | 0.81 | 0.84 | 1.75 | 56 | 0.56 | 0.06 | m.l. | 83.3 | 1.76 | ○ | ○ |
| Ex. 8 | 1.00 | 0.38 | 1.85 | 75 | 0.94 | m.l. | m.l. | 86.7 | 1.83 | ○ | ○ |
| Ex. 9 | 1.01 | 0.40 | 1.83 | 79 | 0.92 | m.l. | m.l. | 87.3 | 1.76 | ○ | ○ |
| Ex. 10 | 0.99 | 0.42 | 1.75 | 78 | 0.86 | m.l. | m.l. | 86.8 | 1.82 | ○ | ○ |
| Ex. 11 | 1.00 | 0.43 | 1.73 | 77 | 0.84 | m.l. | m.l. | 87.4 | 1.65 | ○ | ○ |
| Ex. 12 | 1.00 | 0.46 | 1.71 | 77 | 0.82 | m.l. | m.l. | 87.9 | 1.72 | ○ | ○ |
| Ex. 13 | 1.00 | 0.35 | 1.92 | 78 | 1.04 | m.l. | m.l. | 87.7 | 2.51 | ○ | ○ |
| Ex. 14 | 0.99 | 0.35 | 1.93 | 75 | 1.14 | m.l. | m.l. | 85.7 | 2.54 | ○ | ○ |
| Ex. 15 | 1.00 | 0.35 | 1.95 | 76 | 1.22 | m.l. | m.l. | 86.3 | 3.01 | ○ | ○ |
| Ex. 16 | 1.00 | 0.34 | 1.95 | 74 | 1.31 | m.l. | m.l. | 84.9 | 3.12 | ○ | ○ |
| Ex. 17 | 1.00 | 0.34 | 1.98 | 72 | 1.55 | m.l. | m.l. | 84.6 | 3.33 | ○ | ○ |
| Ex. 18 | 1.15 | 0.31 | 1.98 | 78 | 1.37 | m.l. | m.l. | 85.6 | 3.26 | ○ | ○ |
| Ex. 19 | 1.23 | 0.28 | 2.05 | 80 | 1.61 | m.l. | m.l. | 84.9 | 3.58 | ○ | ○ |
| Ex. 20 | 1.31 | 0.25 | 2.09 | 78 | 1.78 | m.l. | m.l. | 85.7 | 3.46 | ○ | ○ |
| Ex. 21 | 1.00 | 0.35 | 2.02 | 98 | 1.21 | m.l. | m.l. | 83.1 | 4.31 | ○ | ○ |
| Ex. 22 | 1.00 | 0.34 | 2.05 | 79 | 1.25 | m.l. | m.l. | 80.4 | 3.85 | ○ | ○ |
| Ex. 23 | 1.15 | 0.31 | 1.98 | 71 | 1.36 | m.l. | m.l. | 83.7 | 2.89 | ○ | ○ |
| Ex. 24 | 1.15 | 0.31 | 1.83 | 66 | 1.21 | m.l. | m.l. | 84.1 | 2.99 | ○ | ○ |
| Ex. 25 | 1.15 | 0.31 | 1.71 | 63 | 1.05 | m.l. | m.l. | 85.7 | 2.87 | ○ | ○ |
| Ex. 26 | 0.95 | 0.37 | 1.85 | 79 | 0.96 | m.l. | m.l. | 87.7 | 1.86 | ○ | ○ |
| Ex. 27 | 0.86 | 0.49 | 1.79 | 78 | 0.87 | m.l. | m.l. | 88.1 | 1.78 | ○ | ○ |
| Ex. 28 | 0.79 | 0.61 | 1.74 | 78 | 0.81 | m.l. | m.l. | 87.3 | 1.65 | ○ | ○ | analysis after the measurement, each peak shift was corrected based on the peak corresponding to the hydrocarbon among C:1s peaks and each peak bonding state was attributed. Each peak was subjected to Sherley's background removal, and sensitivity coefficient correction (Si=0.87, N=1.77, and O=2.85 for C=1.0) of each element was performed for the peak area to determine the atomic ratio. In this case, peaks belonged to the hydrocarbon were excluded for the calculation of carbon. For the obtained atomic ratio, while the number of atoms of Si was presumed to be 1, the number of atoms of N, O, and C as other components were calculated to determine the proportions of components. The results of the measurement of individual properties are shown in Table 4.

result, the extinction coefficient of the gas barrier film in Example 29, the extinction coefficient of the gas barrier film in Example 30, and the extinction coefficient of the gas barrier film in Example 31 were 0.005, 0.01, and 0.03, respectively.

Comparative Examples 1 to 5

SiN$_x$O$_y$ film

Gas barrier sheets were formed in the same manner as in Examples 1 to 28, except that methods and conditions for film

TABLE 3

| | Method for film formation | | Conditions for film formation | | | | | | |
|---|---|---|---|---|---|---|---|---|---|
| | Production process | Material | Pressure during film formation [Pa] | Ar flow rate [sccm] | Nitrogen flow rate [sccm] | Oxygen flow rate [sccm] | H$_2$O$_2$ flow rate [sccm] | Ammonia flow rate [sccm] | RF power supply frequency [MHz] | Applied electric power [kW] |
| Ex. 29 | PECVD | Hexamethyl-disilazane | 15 | 10 | — | 5 | — | — | — | 1.8 |
| Ex. 30 | PECVD | Hexamethyl-disilazane | 14 | 10 | — | 5 | — | 5 | — | 1.8 |
| Ex. 31 | PECVD | Hexamethyl-disilazane | 15 | 10 | — | — | — | 10 | — | 2.3 |

PECVD: Plasma CVD process

TABLE 4

| | Composition | | | Refractive index | Film thickness | IR absorption | WVTR | OTR | Total light transmittance | YI | Curling Just after film formation | Heat resistance test |
|---|---|---|---|---|---|---|---|---|---|---|---|---|
| | m | l | n | [—] | [nm] | [×10$^{-3}$/nm] | [g/m$^2$·day] | [cc/m$^2$·day·atm] | [%] | [—] | | |
| Ex. 29 | 1.00 | 0.25 | 0.51 | 1.85 | 129 | 1.04 | m.l. | m.l. | 80.3 | 4.33 | ○ | ○ |
| Ex. 30 | 1.00 | 0.31 | 0.31 | 1.98 | 125 | 1.21 | m.l. | m.l. | 81.3 | 3.21 | ○ | ○ |
| Ex. 31 | 1.21 | 0.25 | 0.34 | 2.11 | 82 | 1.25 | m.l. | m.l. | 78.4 | 4.93 | ○ | ○ |

The surface resistivities of the gas barrier films were measured in the same manner as in Examples 1 to 28. As a result, the surface resistivity of the gas barrier film in Example 29, the surface resistivity of the gas barrier film in Example 30, and the surface resistivity of the gas barrier film in Example 31 were $7\times10^{12}$ Ω/sq., $8\times10^{12}$ Ω/sq., and $9\times10^{12}$ Ω/sq., respectively.

The extinction coefficients of the gas barrier films were measured in the same manner as in Examples 1 to 28. As a result, formation were as shown in Table 5. "SP," "IP," and "PECVD" described in the column of "Production process" in Table 5 represent magnetron sputtering, ion plating, and plasma CVD, respectively. The gas barrier sheets thus obtained were evaluated in the same manner as in Examples 1 to 28, except that the measurements of the total light transmittance and YI were not performed. The results are shown in Table 6.

TABLE 5

| | Method for film formation | | Conditions for film formation | | | | | | | |
|---|---|---|---|---|---|---|---|---|---|---|
| | Production process | Material | Pressure during film formation [Pa] | Ar flow rate [sccm] | Nitrogen flow rate [sccm] | Oxygen flow rate [sccm] | H$_2$O$_2$ flow rate [sccm] | Ammonia flow rate [sccm] | RF power supply frequency [MHz] | Applied electric power [kW] |
| Comp. Ex. 1 | SP | Silicon oxide nitride | 0.15 | 30 | — | 5 | — | — | 13.56 | 1.5 |
| Comp. Ex. 2 | IP | Silicon oxide nitride | 0.2 | 10 | — | 5 | — | — | — | 2.1 |
| Comp. Ex. 3 | IP | Silicon nitride | 0.2 | 10 | — | 10 | — | — | — | 2.1 |
| Comp. Ex. 4 | SP | Silicon nitride | 0.15 | 30 | — | 10 | — | — | 13.56 | 1.5 |
| Comp. Ex. 5 | PECVD | Silane | 15 | 10 | 5 | — | — | 10 | 13.56 | 1.3 |

PECVD: Plasma CVD process,
SP: magnetron sputtering process,
IP: ion plating process

TABLE 6

| | Composition | | Refractive index | Film thickness | IR absorption | WVTR | OTR | Curling | |
|---|---|---|---|---|---|---|---|---|---|
| | | | | | | | | Just after film formation | Heat resistance test |
| | x | y | [—] | [nm] | [×10$^{-3}$/nm] | [g/m$^2$ · day] | [cc/m$^2$ · day · atm] | | |
| Comp. Ex. 1 | 0.50 | 1.50 | 1.63 | 80 | 0.3 | 0.21 | 0.35 | ○ | x |
| Comp. Ex. 2 | 0.50 | 0.90 | 1.71 | 82 | 0.1 | 0.10 | 0.20 | ○ | x |
| Comp. Ex. 3 | 1.20 | 0.30 | 1.95 | 85 | 2.0 | m.l. | m.l. | ○ | x |
| Comp. Ex. 4 | 0.50 | 0.90 | 1.65 | 76 | 0.6 | 0.10 | 0.20 | ○ | x |
| Comp. Ex. 5 | 1.50 | 0.25 | 2.25 | 81 | 1.7 | m.l. | m.l. | x | x |

The surface resistivity of the gas barrier film of Comparative Example 1 was measured in the same manner as in Examples 1 to 28. As a result, the surface resistivity of the gas barrier film of Comparative Example 1 was 5×10$^{12}$ Ω/sq.

The extinction coefficient of the gas barrier film of Comparative Example 1 was measured in the same manner as in Examples 1 to 28. As a result, the extinction coefficient of the gas barrier film of Comparative Example 1 was 0.06.

Comparative Examples 6 to 11

SiN$_m$O$_l$C$_n$ Film

Gas barrier sheets were formed in the same manner as in Examples 29 to 31, except that methods and conditions for film formation were as shown in Table 7. "PECVD" described in the column of "Production process" in Table 7 represents plasma CVD. The gas barrier sheets thus obtained were evaluated in the same manner as in Examples 29 to 31, except that the measurements of the total light transmittance and YI were not performed. The results are shown in Table 8.

The surface resistivities of the gas barrier films of Comparative Examples 6 and 10 were measured in the same manner as in Examples 29 to 31 and were found to be 1×10$^{11}$ Ω/sq. and 5×10$^{12}$ Ω/sq., respectively.

The extinction coefficients of the gas barrier film of Comparative Examples 6 and 10 were measured in the same manner as in Examples 29 to 31. As a result, the extinction coefficients of the gas barrier films of Comparative Examples 6 and 10 were 0.04 and 0.15, respectively.

Examples 32 and 33

SiN$_m$O$_l$C$_n$ Film

Gas barrier sheets were formed in the same manner as in Examples 29 to 31, except that methods and conditions for film formation were as shown in Table 9. "IP" and "SP" described in the column of "Production process" in Table 9 represent ion plating and magnetron sputtering, respectively. The gas barrier sheets thus obtained were evaluated in the same manner as in Examples 29 to 31. The results are shown in Table 10.

TABLE 7

| | Method for film formation | | Conditions for film formation | | | | | | | |
|---|---|---|---|---|---|---|---|---|---|---|
| | | | Pressure | Ar | Nitrogen | Oxygen | H$_2$O$_2$ | Ammonia | RF power supply | Applied electric |
| | Production process | Material | during film formation [Pa] | flow rate [sccm] | flow rate [sccm] | flow rate [sccm] | flow rate [sccm] | flow rate [sccm] | frequency [MHz] | power [kW] |
| Comp. Ex. 6 | PECVD | Hexamethyl-disilazane | 10 | 10 | 5 | — | 5 | — | 13.56 | 1.0 |
| Comp. Ex. 7 | PECVD | Hexamethyl-disilazane | 10 | 10 | 5 | — | — | — | 13.56 | 0.5 |
| Comp. Ex. 8 | PECVD | Hexamethyl-disilazane | 50 | 10 | 5 | — | — | — | 13.56 | 1.0 |
| Comp. Ex. 9 | PECVD | Hexamethyl-disilazane | 10 | 10 | 5 | 5 | — | 5 | 13.56 | 0.7 |
| Comp. Ex. 10 | PECVD | Hexamethyl-disilazane | 50 | 10 | 5 | — | — | — | 13.56 | 1.0 |
| Comp. Ex. 11 | PECVD | Hexamethyl-disilazane | 10 | 10 | 5 | 5 | — | 10 | 13.56 | 0.7 |

PECVD: Plasma CVD process

TABLE 8

| | Composition | | | Refractive index | Film thickness | IR absorption | WVTR | OTR | Curling | |
|---|---|---|---|---|---|---|---|---|---|---|
| | | | | | | | | | Just after film formation | Heat resistance test |
| | m | l | n | [—] | [nm] | [×10$^{-3}$/nm] | [g/m$^2$ · day] | [cc/m$^2$ · day · atm] | | |
| Comp. Ex. 6 | 1.30 | 0.25 | 0.05 | 2.13 | 81 | 1.7 | m.l. | m.l. | x | x |
| Comp. Ex. 7 | 1.20 | 0.25 | 1.20 | 2.25 | 78 | 1.7 | m.l. | m.l. | x | x |
| Comp. Ex. 8 | 0.50 | 0.95 | 0.10 | 1.83 | 75 | 0.3 | 0.31 | 0.35 | ○ | ○ |
| Comp. Ex. 9 | 1.50 | 0.28 | 0.80 | 2.28 | 75 | 1.8 | m.l. | m.l. | x | x |
| Comp. Ex. 10 | 0.52 | 1.00 | 0.21 | 1.75 | 80 | 0.6 | 0.21 | 0.32 | ○ | ○ |
| Comp. Ex. 11 | 1.43 | 0.31 | 0.93 | 2.35 | 78 | 1.5 | m.l. | m.l. | x | x |

TABLE 9

| | | Conditions for film formation | | | | | | | |
|---|---|---|---|---|---|---|---|---|---|
| | Method for film formation | Pressure | Ar | Nitrogen | Oxygen | $H_2O_2$ | Ammonia | RF power supply | Applied |
| Production process | Material | during film formation [Pa] | flow rate [sccm] | flow rate [sccm] | flow rate [sccm] | flow rate [sccm] | flow rate [sccm] | frequency [MHz] | electric power [kW] |
| Ex. 32 | IP | Silicon oxide nitride carbide | 0.15 | 10 | 5 | — | — | 5 | 13.56 | 5.6 |
| Ex. 33 | SP | Silicon oxide nitride carbide | 0.15 | 30 | 5 | — | — | 5 | 13.56 | 1.5 |

SP: Magnetron sputtering process,
IP: ion plating process

TABLE 10

| | | | | Refractive | Film | IR | | OTR | Total light | | Curling | |
|---|---|---|---|---|---|---|---|---|---|---|---|---|
| Composition | | | | index | thickness | absorption | WVTR | [cc/m² · day · atm] | transmittance | YI | Just after film formation | Heat resistance test |
| m | l | n | | [—] | [nm] | [×10⁻³/nm] | [g/m² · day] | | [%] | [—] | | |
| Ex. 32 | 1.05 | 0.32 | 0.31 | 2.03 | 83 | 1.32 | m.l. | m.l. | 80.35 | 3.84 | ○ | ○ |
| Ex. 33 | 1.00 | 0.41 | 0.45 | 1.91 | 82 | 1.28 | m.l. | m.l. | 79.21 | 4.21 | ○ | ○ |

The surface resistivities of the gas barrier films of Examples 32 and 33 were measured in the same manner as in Examples 29 to 31 and were found to be $8 \times 10^{11}$ Ω/sq. and $7 \times 10^{11}$ Ω/sq., respectively.

The extinction coefficients of the gas barrier films of Examples 32 and 33 were measured in the same manner as in Examples 29 to 31 and were found to be 0.02 and 0.03, respectively.

The invention claimed is:

1. A gas barrier sheet comprising: a base material; and a gas barrier film provided on the base material, wherein the gas barrier film is an $SiN_xO_y$ film, wherein x=0.5 to 1.5 and y=0.25 to 1, has an absorption intensity of IR absorption (830 cm$^{-1}$ to 840 cm$^{-1}$), corresponding to an Si—N bond, per unit thickness of $0.5 \times 10^{-3}$/nm to $1.8 \times 10^{-3}$/nm and has a refractive index of 1.7 to 2.1.

2. The gas barrier sheet according to claim 1, wherein the gas barrier film has an extinction coefficient of not less than 0.000001 and not more than 0.03.

3. The gas barrier sheet according to claim 2, further comprising a transparent electroconductive film on the gas barrier film.

4. The gas barrier sheet according to claim 2, further comprising a hard coat film on at least one side of the gas barrier sheet.

5. The gas barrier sheet according to claim 2, further comprising an anchor coating agent layer is provided between the base material and the gas barrier film and
the anchor coating agent layer contains at least one material selected from the group consisting of (i) a cardo polymer, (ii) a polyfunctional acrylic resin, (iii) a layered compound, and (iv) a composition comprising a silane coupling agent and a crosslinkable compound, wherein the silane coupling agent contains a first organic functional group and a hydrolysable group, and wherein the crosslinkable compound contains a second organic functional group reactive with the first organic functional group as raw materials.

6. The gas barrier sheet according to claim 1, further comprising a transparent electroconductive film on the gas barrier film.

7. The gas barrier sheet according to claim 6, further comprising a hard coat film on at least one side of the gas barrier sheet.

8. The gas barrier sheet according to claim 6, further comprising an anchor coating agent layer between the base material and the gas barrier film and
the anchor coating agent layer contains at least one material selected from the group consisting of (i) a cardo polymer, (ii) a polyfunctional acrylic resin, (iii) a layered compound, and (iv) a composition comprising a silane coupling agent and a crosslinkable compound, wherein the silane coupling agent contains a first organic functional group and a hydrolysable group, and wherein the crosslinkable compound contains a second organic functional group reactive with the first organic functional group as raw materials.

9. The gas barrier sheet according to claim 1, further comprising a hard coat film on at least one side of the gas barrier sheet.

10. The gas barrier sheet according to claim 9, further comprising an anchor coating agent layer is provided between the base material and the gas barrier film and
the anchor coating agent layer contains at least one material selected from the group consisting of (i) a cardo polymer, (ii) a polyfunctional acrylic resin, (iii) a layered compound, and (iv) a composition comprising a silane coupling agent and a crosslinkable compound, wherein the silane coupling agent contains a first organic functional group and a hydrolysable group, and wherein the crosslinkable compound contains a second organic functional group reactive with the first organic functional group as raw materials.

11. The gas barrier sheet according to claim 1, further comprising an anchor coating agent layer between the base material and the gas barrier film and
the anchor coating agent layer contains at least one material selected from the group consisting of (i) a cardo polymer, (ii) a polyfunctional acrylic resin, (iii) a layered compound, and (iv) a composition comprising a silane coupling agent and a crosslinkable compound, wherein the silane coupling agent contains a first organic functional group and a hydrolysable group, and wherein the crosslinkable compound contains a second organic functional group reactive with the first organic functional group as raw materials.

12. A gas barrier sheet comprising: a base material; and a gas barrier film provided on the base material, wherein
the gas barrier film is an $SiN_mO_lC_n$ film, wherein m=0.5 to 1.5, l=0.25 to 1, and n=0.1 to 1, has an absorption intensity of IR absorption (830 cm$^{-1}$ to 840 cm$^{-1}$), corresponding to an Si—N bond, per unit thickness of 0.5× 10$^{-3}$/nm to 1.5×10$^{-3}$/nm and has a refractive index of 1.8 to 2.3.

13. The gas barrier sheet according to claim 12, wherein the gas barrier film has an extinction coefficient of not less than 0.000001 and not more than 0.03.

14. The gas barrier sheet according to claim 12, further comprising a transparent electroconductive film on the gas barrier film.

15. The gas barrier sheet according to claim 12, further comprising a hard coat film on at least one side of the gas barrier sheet.

16. The gas barrier sheet according to claim 12, further comprising an anchor coating agent layer between the base material and the gas barrier film and
the anchor coating agent layer contains at least one material selected from the group consisting of (i) a cardo polymer, (ii) a polyfunctional acrylic resin, (iii) a layered compound, and (iv) a composition comprising a silane coupling agent and a crosslinkable compound, wherein the silane coupling agent contains a first organic functional group and a hydrolysable group, and wherein the crosslinkable compound contains a second organic functional group reactive with the first organic functional group as raw materials.

* * * * *